US012107580B2

(12) United States Patent
Krishnan et al.

(10) Patent No.: US 12,107,580 B2
(45) Date of Patent: Oct. 1, 2024

(54) SENSOR AND COINCIDENCE RADIATION DETECTION DEVICE

(71) Applicant: mDetect Pty Ltd, South Yarra (AU)

(72) Inventors: Shanti Krishnan, Endeavour Hills (AU); Alan Duffy, Northcote (AU); Craig Webster, Ringwood East (AU)

(73) Assignee: mDetect Pty Ltd, South Yarra (AU)

( * ) Notice: Subject to any disclaimer, the term of this patent is extended or adjusted under 35 U.S.C. 154(b) by 0 days.

(21) Appl. No.: 17/999,899

(22) PCT Filed: May 26, 2021

(86) PCT No.: PCT/AU2021/050503
§ 371 (c)(1),
(2) Date: Nov. 25, 2022

(87) PCT Pub. No.: WO2021/237288
PCT Pub. Date: Dec. 2, 2021

(65) Prior Publication Data
US 2023/0291407 A1 Sep. 14, 2023

(30) Foreign Application Priority Data
May 27, 2020 (AU) ................................ 2020901714

(51) Int. Cl.
*H03K 5/00* (2006.01)
*G01T 1/15* (2006.01)
(Continued)

(52) U.S. Cl.
CPC ............... *H03K 21/08* (2013.01); *G01T 1/15* (2013.01); *G01T 1/17* (2013.01); *H03K 5/24* (2013.01); *H03K 5/02* (2013.01)

(58) Field of Classification Search
CPC . H03K 5/02; H03K 5/24; H03K 21/08; G01T 1/15; G01T 1/17; G01S 7/4861
See application file for complete search history.

(56) References Cited

U.S. PATENT DOCUMENTS

| 5,025,176 A * | 6/1991 | Takeno | H03K 5/084 |
| | | | 327/91 |
| 5,212,459 A * | 5/1993 | Ueda | H03K 3/0231 |
| | | | 331/111 |

(Continued)

FOREIGN PATENT DOCUMENTS

| WO | 2013/027069 A2 | 2/2013 |
| WO | 2021/046602 A1 | 3/2021 |

OTHER PUBLICATIONS

Achtenberg, Krzysztof et al., "Review Of Peak Signal Detection Methods in Nanosecond Pulses Monitoring," Metrol. Meas. Syst., vol. 27, No. 2, pp. 203-218, Jun. 2020.

(Continued)

*Primary Examiner* — Tuan T Lam

(57) ABSTRACT

A pulse detection circuit configured to detect peak pulse values from pulses contained in an input analog signal includes a control circuit to generate a peak control signal based on input from a microcontroller and/or a peak detector, and a peak track/hold circuit to produce an output peak analog signal responsive to the input analog signal and peak control signal. The peak track/hold circuit includes a peak-detect operational amplifier having first and second input terminals to receive the input analog signal and the peak control signal respectively, and a peak-hold capacitor connected to an output terminal of the operational amplifier. The pulse detection circuit includes an analog to digital converter to produce an output peak digital signal from the output peak analog signal. The peak track/hold circuit switches from a tracking mode to a hold mode upon the arrival of the peak control signal generated from the control circuit.

20 Claims, 20 Drawing Sheets

(51) Int. Cl.
    *G01T 1/17*    (2006.01)
    *H03K 5/24*    (2006.01)
    *H03K 21/08*    (2006.01)
    *H03K 5/02*    (2006.01)

(56) References Cited

U.S. PATENT DOCUMENTS

| | | | |
|---|---|---|---|
| 5,272,394 A | 12/1993 | Kirk et al. | |
| 5,442,283 A * | 8/1995 | Vig | G01P 3/489 |
| | | | 324/207.2 |
| 5,982,722 A * | 11/1999 | Hashimoto | G11B 7/094 |
| | | | 369/44.29 |
| 6,025,796 A * | 2/2000 | Crosby, II | G01S 13/88 |
| | | | 342/72 |
| 6,774,617 B2 * | 8/2004 | Andoh | G01R 19/04 |
| | | | 327/94 |
| 7,109,466 B2 * | 9/2006 | Park | H04B 10/6931 |
| | | | 250/214 A |
| 7,518,414 B2 * | 4/2009 | Romero | H03K 5/1532 |
| | | | 327/96 |
| 9,435,897 B2 | 9/2016 | Roy | |
| 9,739,898 B2 | 8/2017 | Hoenk et al. | |
| 2003/0160696 A1 | 8/2003 | Vig et al. | |
| 2006/0125531 A1 | 6/2006 | Romero et al. | |
| 2010/0010343 A1 | 1/2010 | Daghighian et al. | |
| 2011/0057706 A1 * | 3/2011 | Chou | G11C 27/026 |
| | | | 327/332 |
| 2012/0082297 A1 * | 4/2012 | Fox | G01T 1/17 |
| | | | 378/91 |
| 2014/0048683 A1 * | 2/2014 | Soh | H04N 25/75 |
| | | | 250/208.1 |
| 2014/0306117 A1 | 10/2014 | Vacheret et al. | |
| 2014/0336987 A1 | 11/2014 | Frach et al. | |

OTHER PUBLICATIONS

International Application No. PCT/AU2021/050503, International Search Report, Written Opinion, 10 pages, Aug. 10, 2021.

* cited by examiner

Fig. 13

SENSOR AND COINCIDENCE RADIATION DETECTION DEVICE

CROSS-REFERENCE TO RELATED APPLICATIONS

This application is a national stage of International Application No. PCT/AU2021/050503 filed on May 26, 2021; which claims the benefit of and priority to Australian Patent Application No. 2020901714 filed on May 27, 2020; the entire contents of each of which are incorporated herein by reference for all purposes.

FIELD OF THE INVENTION

The present application relates to signal pulse detection and in particular to a pulse detection circuit and method to detect peak pulse values from pulses contained in an input analog signal.

Embodiments of the present invention are particularly adapted for detection of sub-atomic particles such as muons in a sensor and coincidence radiation detection device. However, it will be appreciated that the invention is applicable in broader contexts and other applications.

BACKGROUND

Cosmic rays are high-energy particles travelling through the interstellar space and constitute a continuous flux impinging on the Earth's atmosphere. Relativistic muons are the most penetrating interaction product of the cosmic rays, which reaches the Earth's surface. Studies have estimated that approximately 10,000 muons per square meter hit the Earth's surface each minute. Muons are able to be detected after penetrating thousands of meters of matter before attenuation.

Direct detection and study of cosmic ray showers are traditionally carried out using coincidence measurement techniques, as they allow for a determination of the directional trajectories of high-energy particles from cosmic rays and for muon tomography. Conventional coincidence techniques rely on photomultiplier tubes (PMTs) as the detector for light from plastic scintillators that respond to the radiation. PMTs require a high voltage supply which is typically greater than 700 V for operation. Furthermore, PMTs are fragile, expensive and relatively large (>20 mm). In the field, timing and pulse height measurements obtained by PMT-based techniques use specialised analog front-end instrumentation modules that are typically mounted on crates, making the overall systems large and cumbersome. Signal analysis in these systems is usually performed by data acquisition card on a separate PC.

More recently, Silicon Photomultipliers (SiPMs) in conjunction with specialised dedicated instrumentation modules have been used as detectors for measuring coincidences. It is known to replace PMTs with SiPMs to remove the need for a high voltage supply. However, there are some inherent challenges in utilizing these devices effectively due to potential large dark current, temperature sensitivity and inherent capacitance in the SiPMs.

Designs for software-based coincidence timing have also been explored. However, analog front-ends for these coincidence systems still use specialised electronic modules. While these systems are custom-built and are very useful, they have limitations, especially when multiple coincidence systems are required to be deployed for initial field validation or background measurements, owing to their high cost and labour to build.

For experimental applications which require quantification of absolute pulse heights, it is preferable to resolve input peak heights into as many discrete Analog to Digital Converter (ADC) channels as possible while maintaining the original input linearity. Conventionally, absolute pulse peak values are obtained by sampling the input signal at a high frequency (typically 500 kHz or more) and using the sample closest to the leading edge to calculate the pulse height. However, these parameters are typically beyond the capability of basic low-end microcontrollers. Unfortunately, the provision of a high-speed ADC and a high performance microcontroller significantly increases the cost, complexity and power consumption of the overall circuit, which can be prohibitive for many applications.

Any discussion of the background art throughout the specification should in no way be considered as an admission that such art is widely known or forms part of common general knowledge in the field.

SUMMARY OF THE INVENTION

In a first aspect of the present invention, there is provided a pulse detection circuit configured to detect peak pulse values from pulses contained in an input analog signal, the pulse detection circuit including:
 a control circuit to generate a peak control signal based on input from a microcontroller and/or a peak detector;
 a peak track/hold circuit responsive to the input analog signal and peak control signal to produce an output peak analog signal, the peak track/hold circuit including:
  a peak-detect operational amplifier having first and second input terminals to receive the input analog signal and peak control signal respectively; and
  a peak-hold capacitor connected to an output terminal of the operational amplifier; and
 an analog to digital converter configured to receive the output peak analog signal and produce a corresponding output peak digital signal;
 wherein, the peak track/hold circuit is responsive to the peak control signal to switch between a tracking mode in which the output peak analog signal is proportional to the input analog signal and a hold mode wherein the output peak analog signal is held at a constant peak value indicative of a peak pulse value; and
 wherein, upon the arrival of the peak control signal generated from the control circuit, the peak track/hold circuit switches from the tracking mode to the hold mode.

In some embodiments, the peak track/hold circuit switches from the tracking mode to the hold mode upon detection of a beginning of a trailing edge of pulses within the analog input signal by the peak detector and/or microcontroller.

In some embodiments, the control circuit is further configured to generate a baseline control signal based on input from the microcontroller and/or peak (e.g., edge) detector. In some embodiments, the microcontroller or peak (e.g., edge) detector is configured to also detect a rising edge of pulses within the input analog signal.

In some embodiments, the pulse detection circuit further includes a baseline track/hold circuit responsive to the input analog signal and baseline control signal to produce an output baseline analog signal. The baseline track/hold circuit may include:
- a baseline-detect operational amplifier having first and second input terminals to receive the input analog signal and baseline control signal respectively; and
- a baseline-hold capacitor connected to an output terminal of the operational amplifier.

The baseline track/hold circuit may be responsive to the baseline control signal to switch between a tracking mode in which the output baseline analog signal is proportional to the input analog signal and a hold mode wherein the output analog signal is held at a constant value indicative of a value of the input analog signal prior to the pulse arriving.

The baseline control signal may switch the baseline track/hold circuit from the tracking mode to the hold mode upon detection of a rising edge of a pulse by the microcontroller and/or the peak detector (e.g., edge-peak detector circuit).

In some embodiments, the pulse detection circuit includes an analog delay circuit connected to the first input terminal of the baseline-detect operational amplifier to apply a time delay to the received input analog signal. The analog delay circuit may include an analog delay line.

In some embodiments, the peak detector has a finite response time and the analog delay circuit delays the input analog signal by a time delay to compensate for the finite response time.

In some embodiments, the analog to digital converter is a low sample rate device having a sampling rate in the kHz range.

In some embodiments, the peak control signal switches the peak-detect operational amplifier into a shutdown mode when the peak track/hold circuit is in the hold mode.

In some embodiments, the baseline control signal switches the baseline-detect operational amplifier into a shutdown mode when the baseline track/hold circuit is in the hold mode.

In some embodiments, the analog to digital converter is a differential analog to digital converter. The output baseline analog signal may be input to a first input terminal of the differential analog to digital converter and the output peak analog signal is input to a second input terminal of the differential analog to digital converter.

In some embodiments, the analog to digital converter is included within the microcontroller. In other embodiments, the analog to digital converter is an external analog to digital converter that is external to the microcontroller and/or the peak detector.

In some embodiments, the output baseline analog signal is simultaneously fed to both the external analog to digital converter and an analog to digital converter within the microcontroller and/or the peak detector to detect a saturation and/or baseline outside of a predetermined range for the input analog pulse.

In a second aspect of the present invention, there is provided a pulse detection method to detect peak pulse values from pulses contained in an input analog signal, the pulse detection method including:
- generating a peak control signal based on input from a microcontroller and/or a peak detector;
- inputting the input analog signal and peak control signal to a peak track/hold circuit to produce an output peak analog signal, wherein the peak track/hold circuit is responsive to the peak control signal to switch between a tracking mode in which the output peak analog signal is proportional to the input analog signal and a hold mode wherein the output peak analog signal is held at a constant peak value indicative of a peak pulse value, and wherein the peak control signal switches the peak track/hold circuit from the tracking mode to the hold mode upon detection of a beginning of a trailing edge of a pulse by an edge-peak detector circuit; and
- transmitting the output peak analog signal to an analog to digital converter to produce a corresponding output peak digital signal.

In some embodiments, the peak track/hold circuit switches from the tracking mode to the hold mode upon detection of a beginning of a trailing edge of pulses within the analog input signal by the peak detector and/or the microcontroller (e.g., edge-peak detector circuit).

In some embodiments, the method further includes the step of generating a baseline control signal from the microcontroller and/or the peak detector, wherein the microcontroller and/or the peak detector is configured to also detect a rising edge of pulses within the input analog signal.

In some embodiments, the method further includes the steps of:
inputting the input analog signal and baseline control signal to a baseline track/hold circuit to produce an output baseline analog signal, wherein the baseline track/hold circuit is responsive to the baseline control signal to switch between a tracking mode in which the output baseline analog signal is proportional to the input analog signal and a hold mode wherein the output analog signal is held at a constant value indicative of a value of the input analog signal prior to the pulse arriving, and wherein the baseline control signal switches the baseline track/hold circuit from the tracking mode to the hold mode upon detection of a rising edge of a pulse by the edge-peak detector circuit.

In some embodiments, the method includes the step of applying a time delay to the received input analog signal before input to the baseline track/hold circuit. In some embodiments, the time delay is equal to or greater than a finite response time of the edge-peak detector.

BRIEF DESCRIPTION OF THE FIGURES

Example embodiments of the disclosure will now be described, by way of example only, with reference to the accompanying drawings in which:

FIG. 13 illustrates sample timestamped data streams for three test cases with and without a correction factor and GPS as the PPS source;

DESCRIPTION OF THE INVENTION

Embodiments of the present invention are described herein with reference to the application of a cosmic ray detector for detecting cosmic muons. One particular application is the detection and location of specific bodies of ore, or improving knowledge of rock structures more generally, to aid in the detection of gold buried underground. However, it will be appreciated that the invention is also capable of detecting a broader range of sub-atomic particles such as alpha and beta particles, as well as gamma rays. The invention also has broader applications such as determining air pockets in block caving, carbon sequestration, non-invasive internal scanning of pipes or vessels that traditional penetrating techniques are ineffective, and medical imaging.

System Overview

Figure 1:
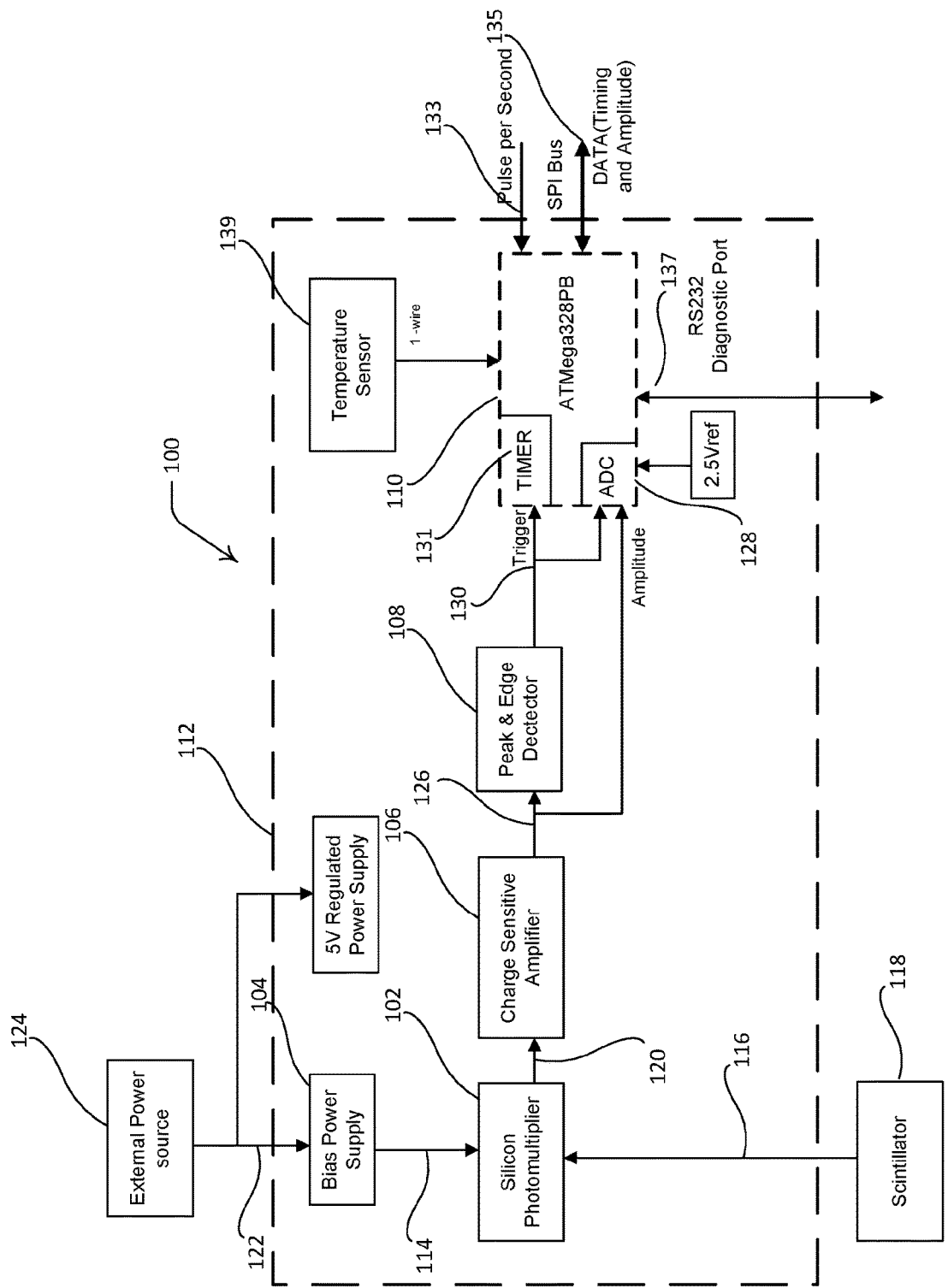
FIG. 1 is a schematic system-level diagram of a sensor for detecting sub-atomic particles.
Figure 2A:
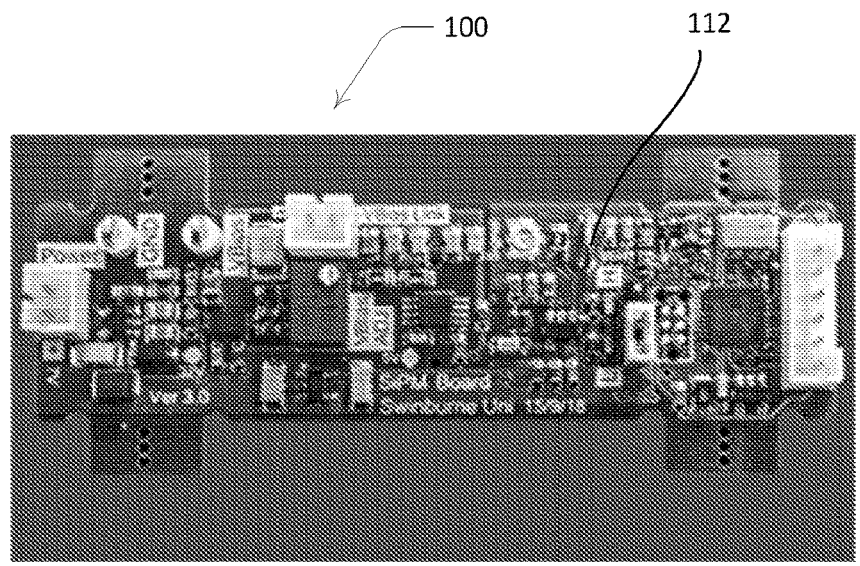
FIG. 2A is a top plan view of a sensor for detecting sub-atomic particles formed on a single integrated circuit board.
Figure 2B:
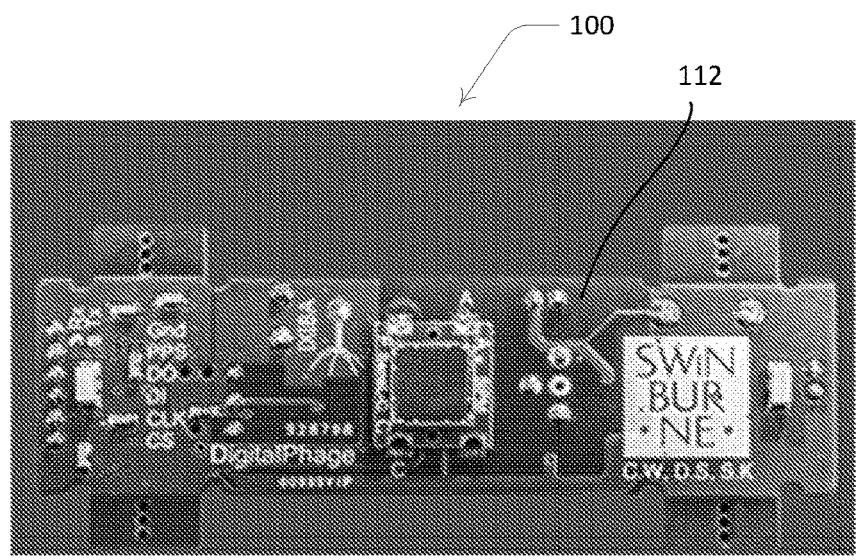
FIG. 2B is a bottom plan view of the sensor of FIG. 2A.

Referring initially to FIGS. 1 and 2, there is illustrated a sensor 100 for detecting sub-atomic particles. Sensor 100 is suitable for integration into a radiation detection device such as the coincidence radiation detection device 300 illustrated in FIG. 3. As will be described in detail below, sensor 100 includes a photomultiplier device such as a silicon photomultiplier (SiPM) 102 driven by a bias voltage supply circuit 104. A charge sensitive amplifier 106 is configured to amplify and stretch output electrical pulses from SiPM 102.

An edge-peak detector circuit 108 detects and generates a trigger for rising edge pulse timing and maximum peak height values, and a local microcontroller 110 performs critical edge timing and pulse height measurement, as well as other functions. The operation of sensor 100 (called a "smart sensor") and the various components are described in detail below.

Smart Sensor Operation

As best illustrated in FIG. 2, sensor 100 is formed on a single integrated circuit board 112, and preferably all electrical components are mounted thereon. However, as described below, in some embodiments, a subset of the components of sensor 100 may reside separate to circuit board 112.

As mentioned above in relation to FIG. 1, sensor 100 includes a photomultiplier device such as a silicon photomultiplier (SiPM) 102. SiPM 102 is powered by an input power signal 114 and configured to receive incident optical pulses 116 of photons from an associated scintillator device 118 and, in response, generate an input electrical signal 120 having corresponding electrical pulses.

SiPM 102 may be connected to scintillator device 118 in a number of different ways. In one embodiment, SiPM 102 is in direct contact with scintillator device 118 to provide a direct coupling between the two components. When SiPM 102 is mounted on circuit board 112, the circuit board will provide physical support to hold SiPM 102 in position onto the scintillator device 118. This embodiment enables all components to be contained on one circuit board.

In another embodiment, a light guide (similar in principle to an optical fibre) is used to bridge a gap between scintillator device 118 and SiPM 102. This arrangement is typically used when the shape of scintillator device 118 does not match the shape of SiPM 102.

In a further embodiment, SiPM 102 is mounted on scintillator device 118 separate from circuit board 112, and the separate SiPM/scintillator is electrically connected to circuit board 112 via an electrical connection.

In each of the embodiments above, an optical coupling grease or index matching gel may be employed between scintillator device 118 and SiPM 102 or the light guide for reducing optical reflections and improving a signal-to-noise ratio.

Scintillator device 118 may be any commercially available scintillator device suitable for converting energy from incident charged particles (such as muons) into corresponding pulses 116 of photons. By way of example, a suitable scintillator device is a Bicron BC-408 plastic scintillator (Polyvinyltoluene-PVT).

Similarly, SiPM 102 may be any commercially available device such as an FC-6035 6 mm SiPM manufactured by SensL Technologies Ltd (owned by ON Semiconductor), which includes an array of avalanche photodiode microcells operated in the Geiger mode and connected in parallel to a common output. SiPM 102 produces a uniform and quantised amount of charge which is directly proportional to the number of incident photons. In some embodiments, SiPM 102 converts the scintillation pulses into electrical pulses of width of about 2 μs.

An SiPM type photomultiplier is selected as a preferred scintillation detector as it has the physical benefits of compactness, robustness, low operating voltage and low cost while having a gain comparable to a Photomultiplier tube (PMT). These features make it suitable for use in the design of modular coincidence systems which are easily scalable. The main challenges in using an SiPM are noise (dark counts), high capacitance, sensitivity to temperature, and physical coupling to the scintillator due to the small surface area of the SiPM (6 mm×6 mm). In other embodiments, SiPM 102 may be replaced with other types of photomultiplier such as conventional photomultiplier tubes, hybrid photomultiplier tubes, conventional silicon or germanium photodiodes or Large-Area Avalanche Photo-diode (LAAPD).

The input power signal 114 is provided by a bias voltage power supply circuit 104 located on circuit board 112, which is configured to receive a power signal 122 from an external power source 124 such as a mains power supply or battery and generate the input power signal 114.

Figure 4:
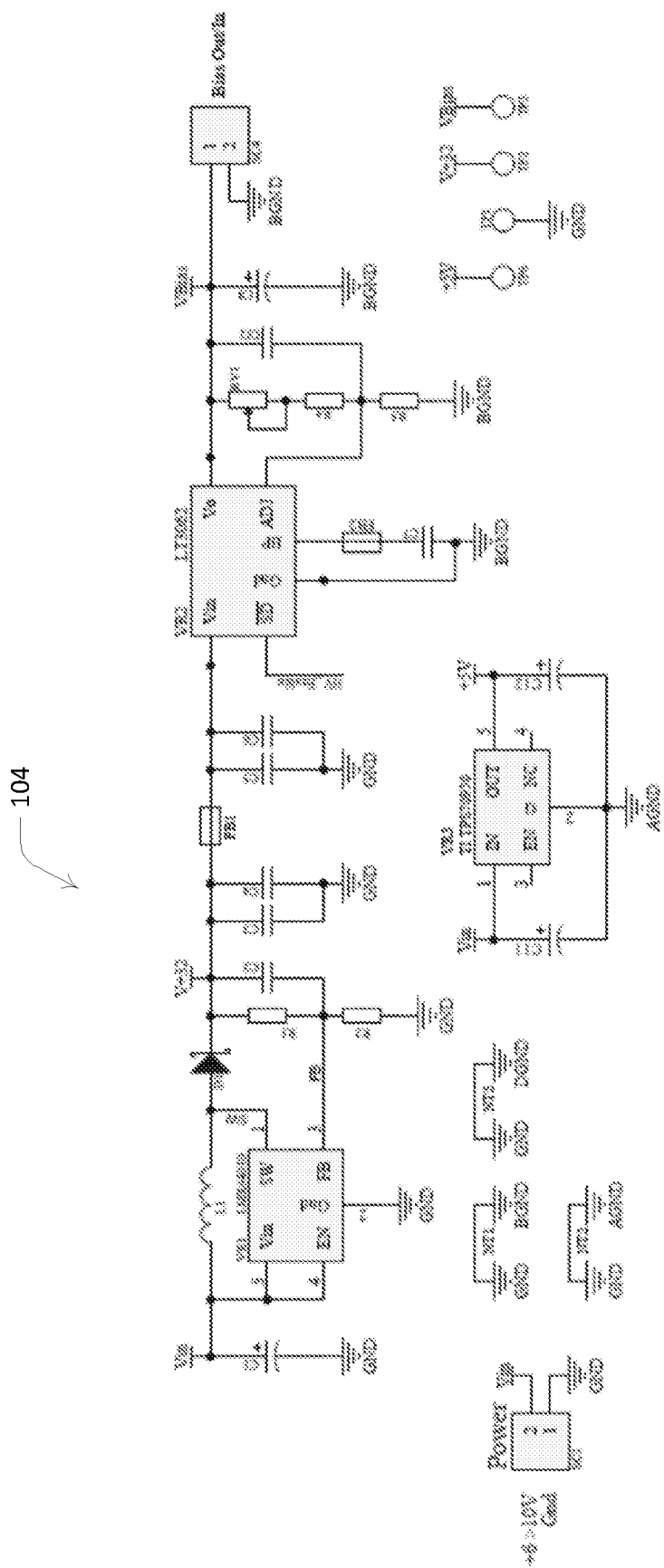
FIG. 4 is a circuit diagram of a hybrid bias voltage power supply circuit suitable for powering the sensors of FIGS. 1-4.

In some embodiments, bias voltage power supply circuit 104 includes an adjustable hybrid power supply circuit to convert an unregulated power signal 122 to the input power signal 114 delivered to SiPM 102. An example hybrid power supply circuit is illustrated schematically in FIG. 4. In this illustrated embodiment, all the components in sensor 100 are supplied by a distributed unregulated +7 V power supply. SiPM 102 requires a base voltage of +24.5 V+overvoltage. This is achieved by using a hybrid power supply generated using a combination of Switch Mode Power Supply regulator (SMPS) LMR64010 and linear regulator LT3062, as shown in the circuit. The LMR64010 SMPS is used to step up the voltage from +7 V to +32 V. However, as it has an output voltage ripple of about ~20 mV, SMPS circuit is followed by a linear power supply LT3062, which has a high Power Supply Rejection Ratio (PSRR)/Input ripple rejection of >50 dB at the switching frequency of SMPS (1.6 MHZ).

Thus, a combination of SMPS and an adjustable linear power supply reduces the power supply ripple, and is used to generate the required overbias over a range of +25 V to +30 V. As the SensL FC-60035 SiPM has a very low quiescent current requirement (~20 µA), it has been possible to use a single bias power supply (Vbias) to power up to 4 SiPMs with no additional regulation.

Figure 5:
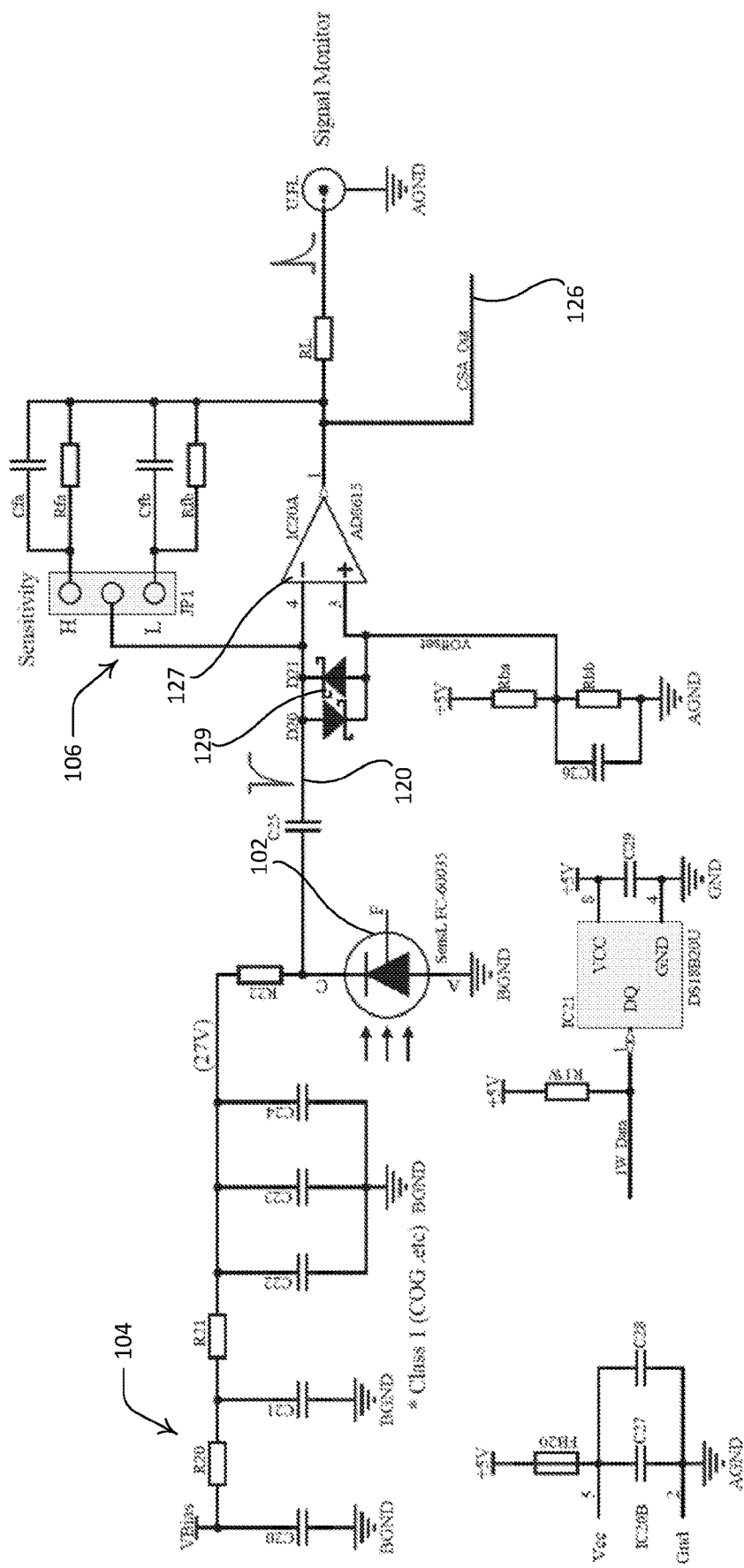
FIG. 5 is a circuit diagram of an analog front end of a sensor as illustrated in FIGS. 1-4 including a charge sensitive amplifier circuit and temperature sensor.

Returning to FIG. 1, the output of SiPM 102 (input electrical signal 120) is connected to an operational amplifier (op-amp) based charge sensitive amplifier (CSA) 106, which receives input electrical signal 120 and outputs an amplified electrical signal 126 in which the electrical pulses are amplified and stretched in time. An exemplary circuit diagram of an analog front end of sensor 100, including CSA 106, is illustrated in FIG. 5.

CSA 106 integrates the SiPM's charge pulses on its feedback capacitor, giving it the characteristics of high noise immunity. The output of CSA 106 is independent of the SiPM's effective high capacitance (nF range), making it suitable for SiPM based muon detection systems. This independence of capacitance is shown by:

$$V_o = Q_d/C_f$$

$$\tau = R_f * C_f \quad (1)$$

where $V_o$=Voltage Output of CSA; $\tau$=decay time constant; $Q_d$=Charge released by the SiPM; $R_f$=feedback resistor; $C_f$=Feedback capacitor.

$$BW = (GBW * C_f)/(C_{det} + C_f) \quad (2)$$
$$= (24 * 10^6 * 100 * 10^{-12})/(3.4 * 10^{-9} + 100 * 10^{-12})$$
$$= 6.8 \text{ kHz}$$

where BW is the Bandwidth of the coincidence system; GBW is the Gain-Bandwidth product of the CSA op-amp and $C_{det}$ is the Capacitance of SiPM.

Using equation 1, the calculated bandwidth of this coincidence system is 6.8 kHz, which is sufficient for the distinct detection of particles such as muons, whose arrival rate on the surface of the Earth is 1 muon/cm²/min.

As illustrated in FIG. 5, CSA 106 uses a large feedback resistor (1 MΩ) to minimise noise ($R_f$ is a noise source). As a result, the bias current must be in the picoampere (pA) range to prevent the output from drifting. CSA 106 includes an op-amp circuit having an op-amp 127 which is required to be compatible with a voltage range (e.g. 0 to +5 V) of an analog to digital converter (ADC) 128 of local microcontroller 110. Op-amp 127 is also required to have the current capability to drive a signal monitor output (up to 50 mA) for testing purposes, peak and edge detector 108 for timing (surge current up to 10 mA), and ADC 128 for pulse height detection. As illustrated in FIG. 5, op-amp 127 may be an AD8615 op-amp by Analog Devices, Inc, which runs on a single +5 V rail, has input bias current of 0.2 pA and has a current capability of (+150 mA). However, it will be appreciated that other suitable components may be used in place of op-amp 127 and CSA 106 more broadly.

As SiPM 102 is directly connected to CSA 106, a large current pulse from SiPM 102 via input electrical signal 120 could drive op-amp 127 into saturation (where the output would hit the positive rail). This would result in a large voltage up to +27 V (representing the bias voltage of the SiPM) across the differential inputs of op-amp 127 and could potentially damage the op-amp, as the maximum differential voltage allowable for this op-amp is 6 V. To prevent this condition, CSA 106 includes back-to-back Schottky diodes 129 that are placed across the input. The non-inverting input is maintained at 0.8 V, to allow for a small undershoot in the output. In some embodiments, it is preferable to define the resistive and capacitive components of CSA 106 to define time constants of around 100 µs as such time constants are suitable to enable local microcontroller 110 to sample the signal.

Figure 6:
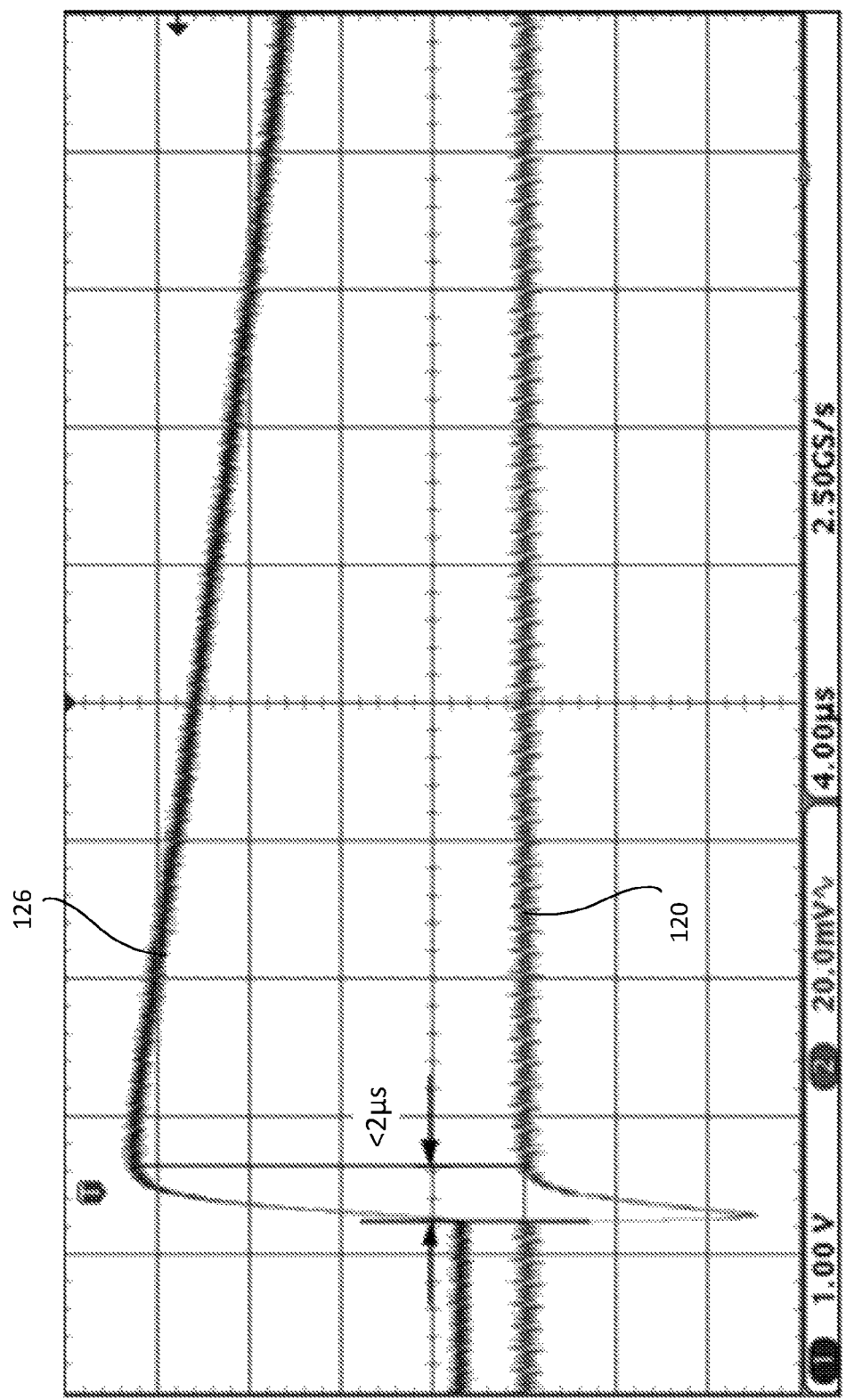
FIG. 6 is a plot of voltage versus time of both an input and an output electrical signal to a charge sensitive amplifier circuit across a short time window around the commencement of a pulse.
Figure 7:
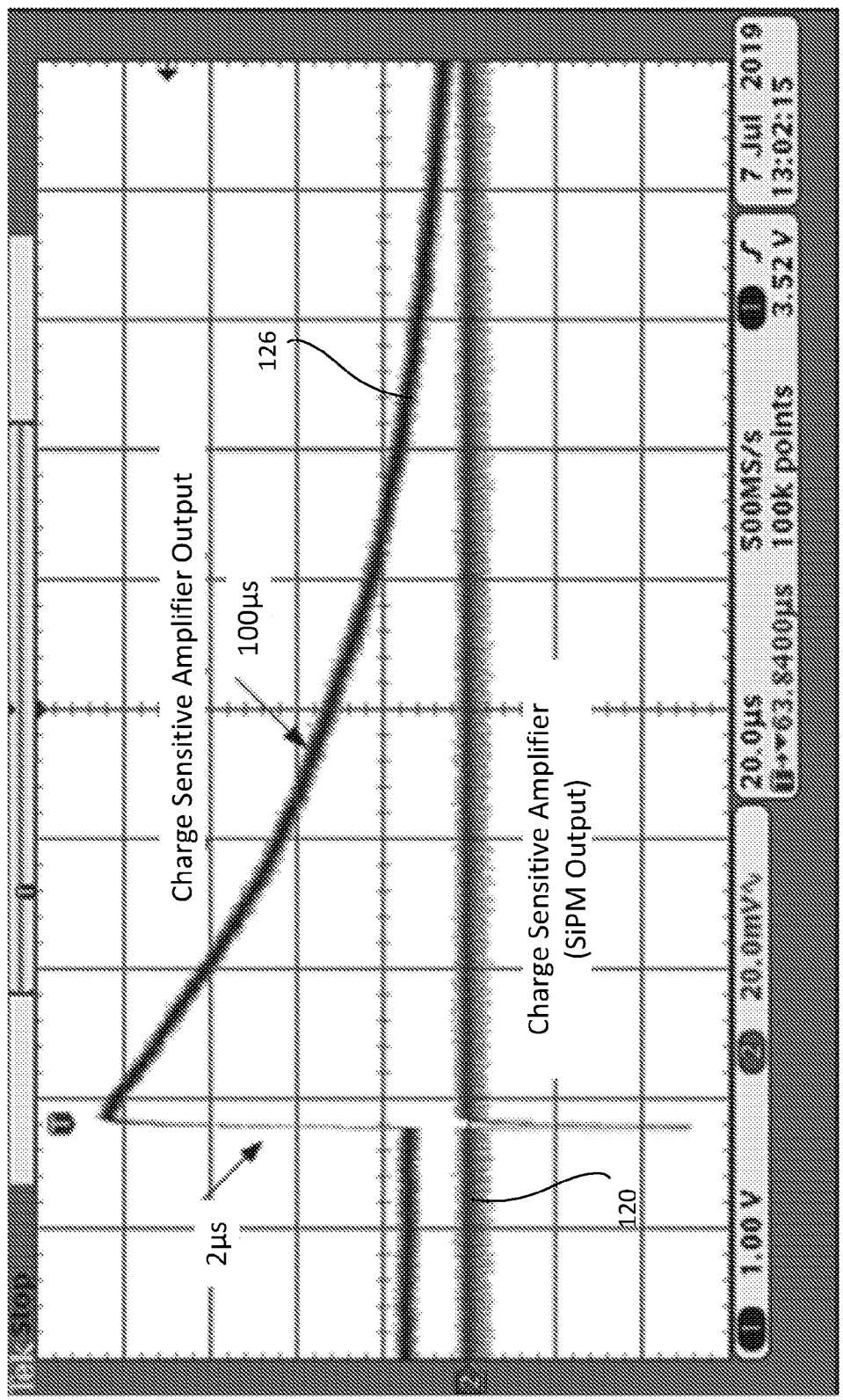
FIG. 7 is a plot of voltage versus time of both an input and an output electrical signal to a charge sensitive amplifier over a wider time window than FIG. 6 and illustrating a slowly decaying trailing edge of a stretched output pulse.

FIGS. 6 and 7 illustrate plots of an exemplary input and output signal from CSA 106 showing a fast rising edge (2 µs) of an electrical pulse and a slow trailing edge (T=100 µs) generated from a short sharp input pulse from SiPM 102. FIG. 6 illustrates a short time window around the commencement of the pulse while FIG. 7 illustrates a wider time window that more clearly shows the slowly decaying trailing edge of the stretched output pulse is used for peak detection by the microcontroller-based ADC.

Referring again to FIG. 1, CSA 106 outputs amplified electrical signal 126 having amplified and stretched pulses. Amplified electrical signal 126 is transmitted to edge-peak detector circuit 108. An exemplary edge-peak detector circuit 108 is shown schematically in FIG. 8, which utilises an MCP6561-R type op-amp component developed by Microchip Technology Inc. However, it will be appreciated that variations on this design in terms of components and values may be used. Edge-peak detector 108 is configured to perform three main functions:

- Detect a fast rising edge of the electrical pulses from amplified signal 126;
- Detect a beginning of a trailing edge of the electrical pulses from amplified signal 126; and
- Detect a pulse peak value being a voltage value measured at the beginning of the trailing edge of the electrical pulses from amplified signal 126.

Figure 9:
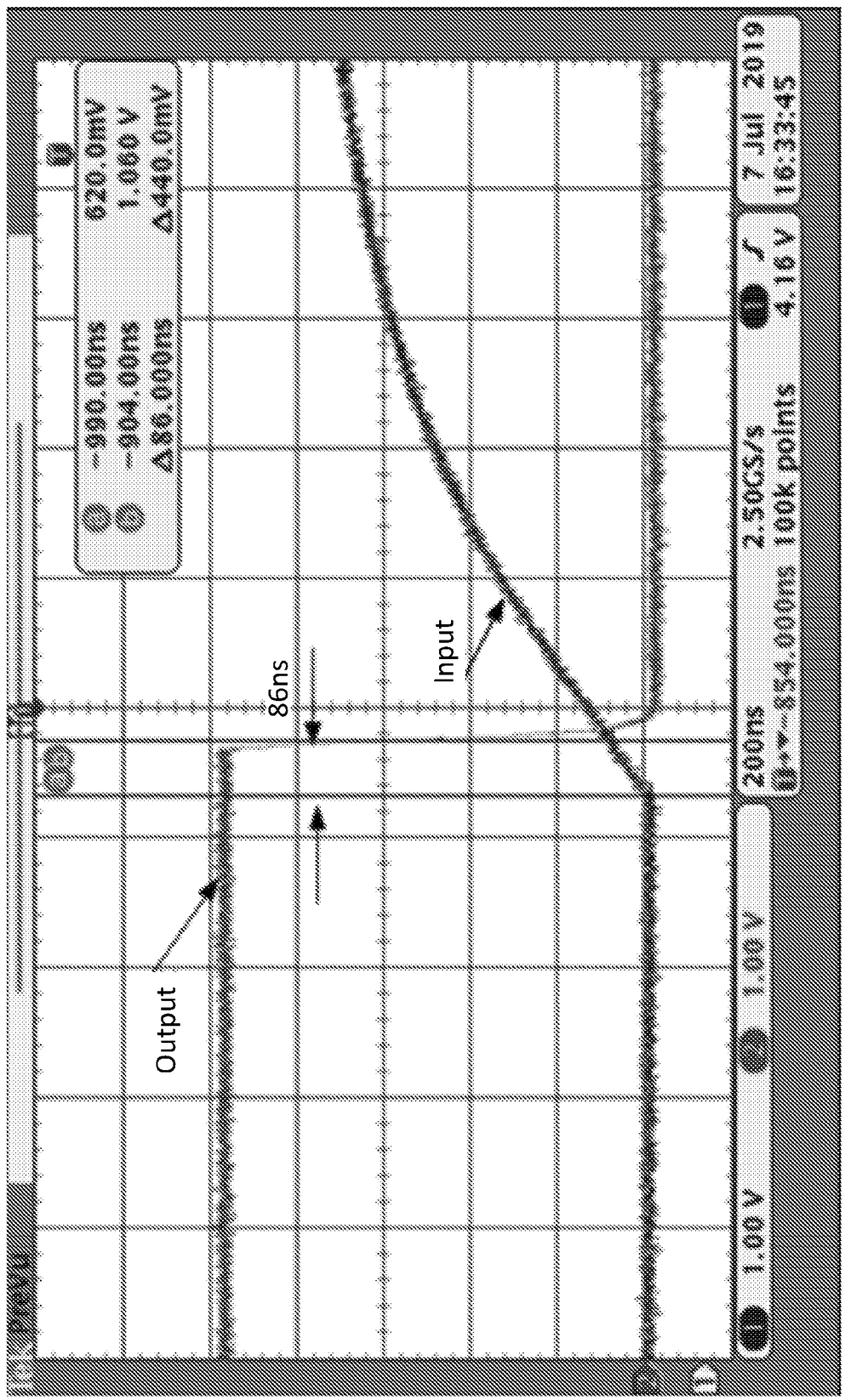
FIG. 9 is a plot of voltage versus time of both an input and an output electrical signal to the edge-peak detector circuit of FIG. 8 across a short time window centred around the commencement of a pulse signal.

In operation, edge-peak detector 108 essentially acts as a high-pass filter generating a logic output pulse which is used to trigger pulse timing for coincidence detection, as well as to start an analog to digital conversion process. FIG. 9 illustrates a plot of a rising edge of an input pulse from amplified signal 126 together with a corresponding output signal of edge-peak detector 108. As illustrated, the first transition of the output of edge-peak detector 108 occurred less than 100 ns after the rising edge of the amplified pulse, and this transition is used to generate a trigger signal 130 to trigger a timestamping timer module 131 of local microcontroller 110 as illustrated in FIG. 1.

Figure 10:
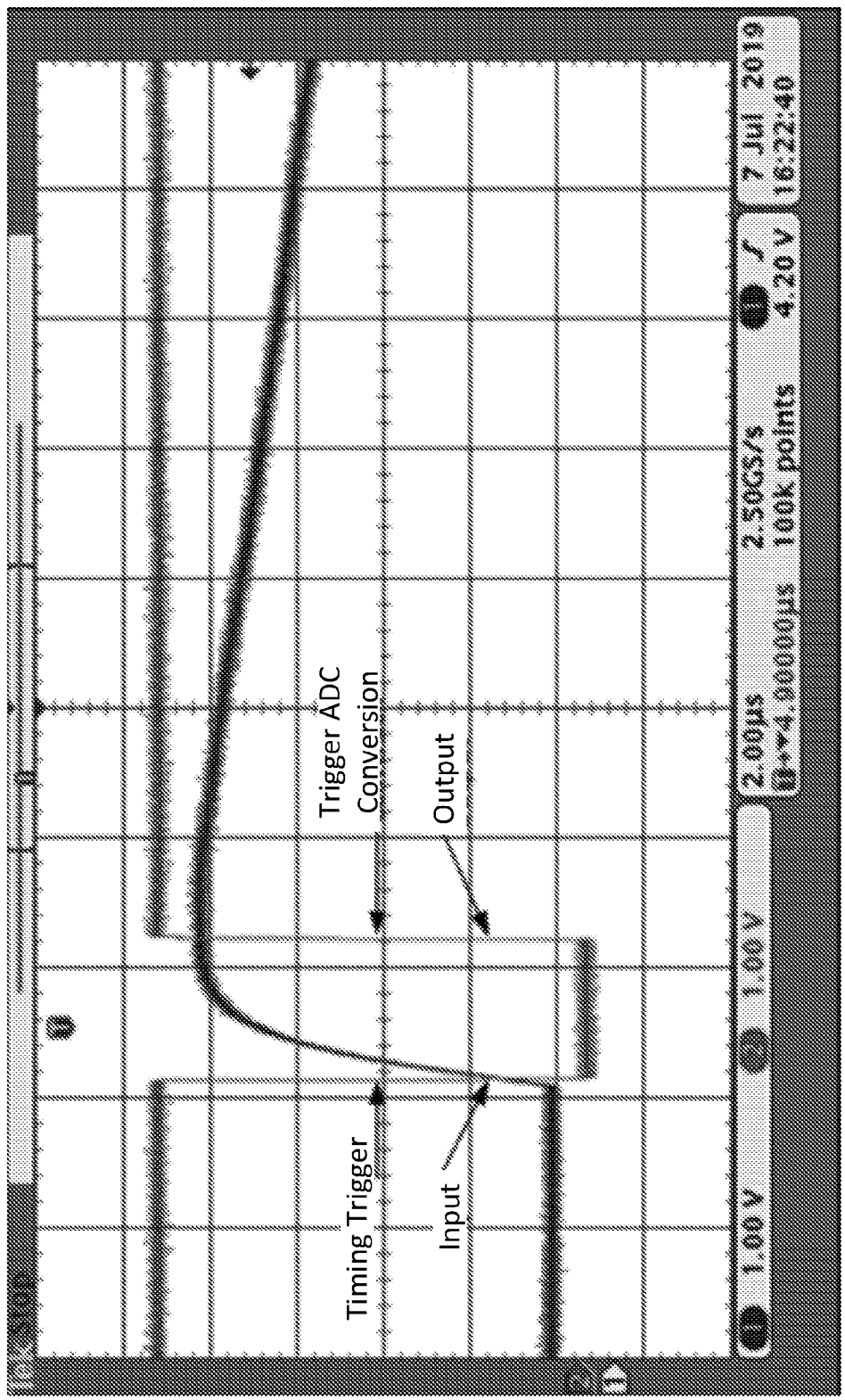
FIG. 10 is a plot of voltage versus time of both an input and an output electrical signal to the edge-peak detector circuit of FIG. 8 across a wider time window showing both a fast leading edge and slow trailing edge of a pulse signal.

Referring now to FIG. 10, there is illustrated an expanded time window of the data of FIG. 9, showing both the rising edge and falling edge of the input pulse from amplified signal 126. As illustrated, a second transition in the output of edge-peak detector 108 occurs as the rising edge rolls off at the peak of the pulse. This second transition is used to start the analog to digital conversion by ADC 128. Thus, the fast rising edge (2 μs) of the pulse output of the CSA, as shown in FIG. 6, is used by edge-peak detector 108 to trigger a timestamping event and send trigger signal 130 to timer module 131, while the slow trailing edge (τ=100 μs), as indicated in FIG. 7, is used for peak detection by the microcontroller-based ADC 128.

Figure 8:
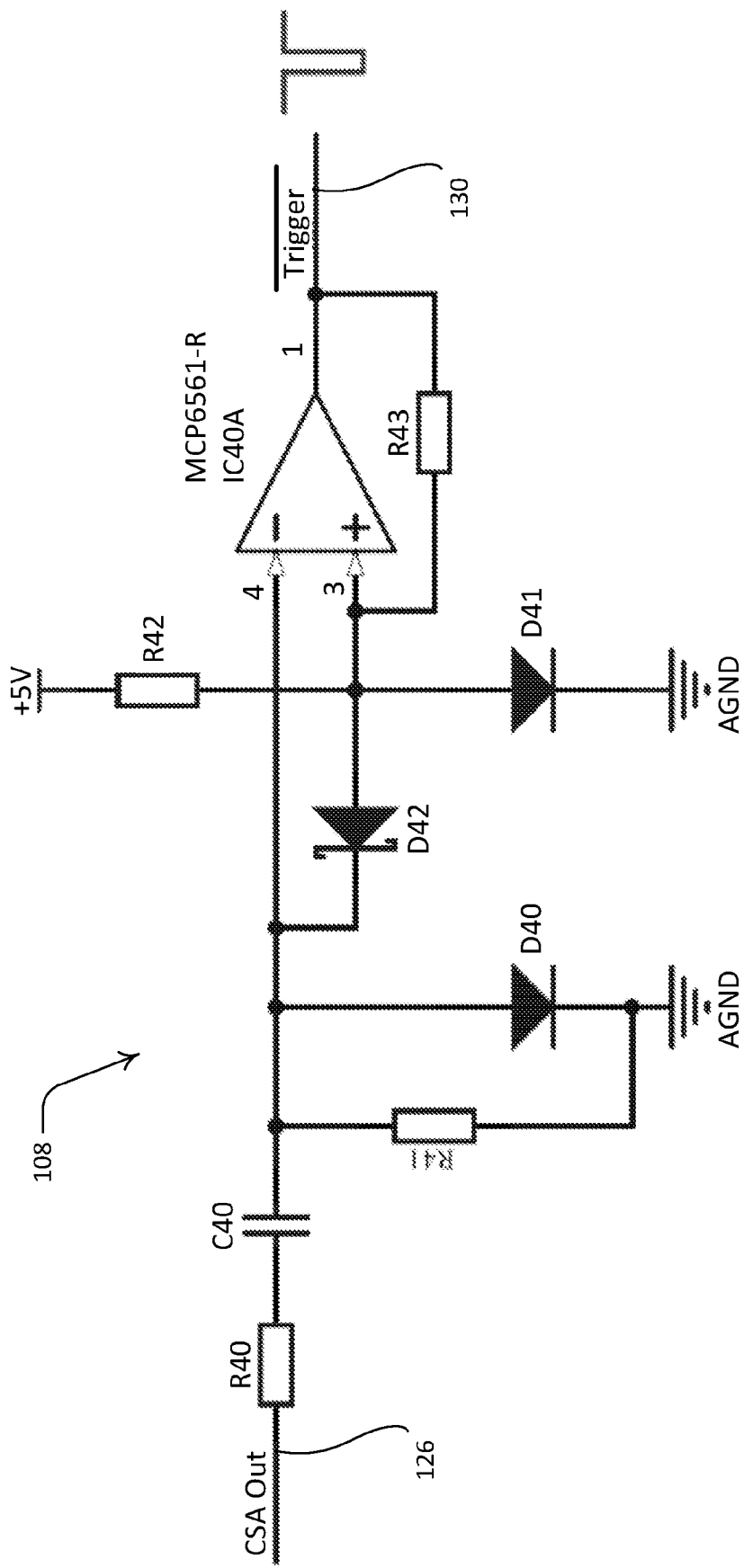
FIG. 8 is a circuit diagram of an edge-peak detector circuit suitable for use in the sensor of FIGS. 1-4.

For validation purposes, the circuit of FIG. 8 was simulated using the LTSpice circuit simulation software produced by Linear Technology Corporation. The results of the actual circuit and simulated circuit were found to be comparable.

Figure 11:
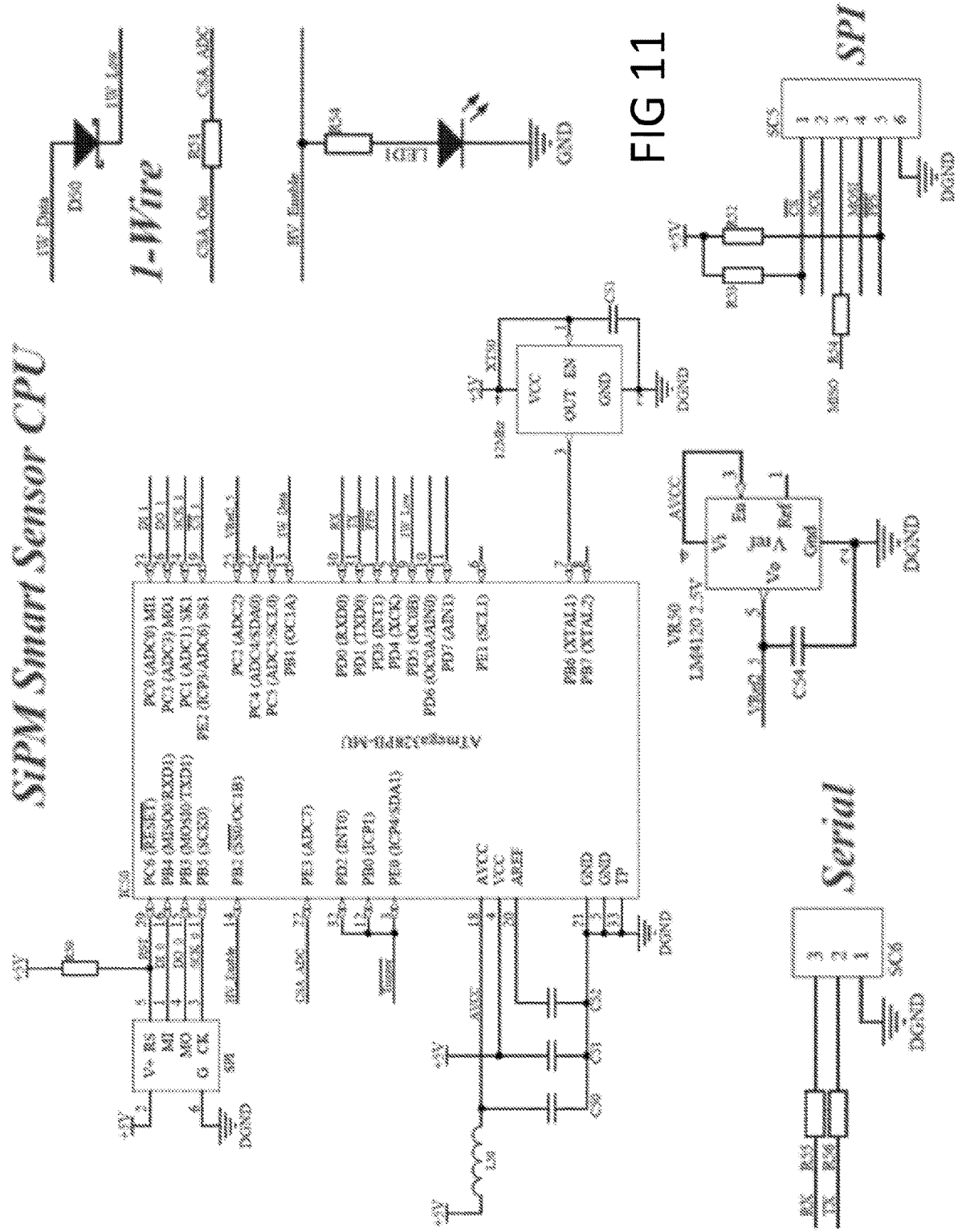
FIG. 11 is a schematic system level diagram of an exemplary local microcontroller suitable for use in the sensor of FIGS. 1-4.

Referring again to FIG. 1, the output trigger signal 130 from edge-peak detector 108 is transmitted to timer module 131 of local microcontroller 110, while amplified electrical signal 126 is transmitted from CSA 126 directly to ADC module 128 of local microcontroller 110. A system level diagram of an exemplary local microcontroller 110 is illustrated schematically in FIG. 11. Here, microcontroller 110 comprises an ATmega328PB microcontroller device developed by Microchip Technology Inc.

As best shown in FIG. 1, timer module 131 includes a timing circuit configured to generate timestamp values for each of the detected pulses in response to the detected pulse edge. The timing circuit of timing module 131 is also responsible for synchronising the timestamp values with a reference clock signal to generate timestamp values for each of the pulses detected by edge-peak detector 108. In the illustrated embodiment, the clock signal is an externally generated pulse per second (PPS) signal 133. Use of an external clock signal allows for synchronising the pulse timing of sensor 100 with that of other sensors for coincidence detection.

In conjunction with the external clock signal, timer module 131 may also generate a local internal clock signal (such as from a crystal or atomic oscillator device integrated onto circuit board 112). Where sensor 100 is used as a standalone device, this internal clock signal may be sufficient for timestamping and no external clock signal required. Where multiple sensors are used for coincidence detection, the internal clock signal may be used for local timestamping of the detected pulses and these timestamps can be subsequently synchronised with those of other sensors using a common external clock signal (as described below).

A suitable internal crystal oscillator for use in timer module 131 is a KC5032 A-CM manufactured by Kyocera Kinseki Corporation, which generates a clock frequency of 12 MHZ with a tolerance of ±0.005%. A divide by 8 prescaler may be used to derive the subsequent local clock timer. With this arrangement, the expected counts from sensor 100 over 1 second (1 PPS cycle) is $1.5 \times 10^6$. However, due to the frequency tolerance of the crystal (i.e. ±0.005%), the timing count value from timer module 131 could have a deviation of ±75 clock cycles, which equates to ±49.95 μs.

Local microcontroller 110 also includes ADC module 128, which is configured to record pulse height values of the electrical pulses output from CSA 106. In the illustrated embodiment, ADC module 128 is a 10-bit device which digitises the CSA output amplified signal 126 (in a range 0 V to +5V) with a resolution of ~4.88 mV. In order to obtain better precision, the calibration of the ADC quantisation steps was performed against an external +2.5 V reference.

Finally, local microcontroller 110 includes a communications interface in the form of serial peripheral interface (SPI) port 135 configured to communicate the timestamp values and pulse height values to an external memory device or to coincidence radiation detection device 300 for subsequent processing in a manner described below. In some embodiments, the local microcontroller 110 includes a local memory component such as a Random Access Memory (RAM) or Electronically Erasable Programmable Read-Only Memory (EEPROM) device and the timestamp values and pulse height values are stored locally.

In the illustrated embodiment, local microcontroller 110 also includes RS232 communications port 137 adapted for sending and receiving data to a PC for diagnostic purposes or when using sensor 100 as a stand-alone device. In other embodiments, it will be appreciated that data may be transmitted to and from local microcontroller 110 via any known communication type including an Ethernet connection, USB, coaxial connection, optical fibre, LORA, WiFi or Bluetooth connection.

For a given bias voltage, the gain of SiPM 102 is affected by temperature. Hence a temperature sensor 139 is mounted close to SiPM 102, which is in communication with local microcontroller 110 and used to monitor and record the SiPM temperature. If needed, correction for drift in gain can be performed in post-processing by factoring referencing temperature values at times corresponding to pulse detection. By way of example, temperature sensor 139 may be a DS18B 20U digital temperature sensor device manufactured by Maxim Integrated Products, Inc, which communicates through a 1-wire interface to local microcontroller 110.

For coincidence purposes, the timing circuit of timer module 131 generates 21-bit timestamping information and is synchronised with an external pulse per second timer. In other embodiments, the timing circuit preferably includes at least a 17-bit timer.

To effectively detect the occurrence of sub-atomic particles such as muons, the timer module 131 should fulfil the following two timing criteria:
  The timer should run for at least 1 PPS (i.e. 1 second) without overflow; and
  The timer should have a timing resolution of less than 1 μs.

To meet the above criteria, there is a need for at least a 20-bit timer. However, as many common microcontroller components commercially available only include 16-bit timers, the inventors have developed a method to generate a 21-bit timer by combining two 16-bit timers operating at different speeds but being derived from a common clock source.

Figure 12:
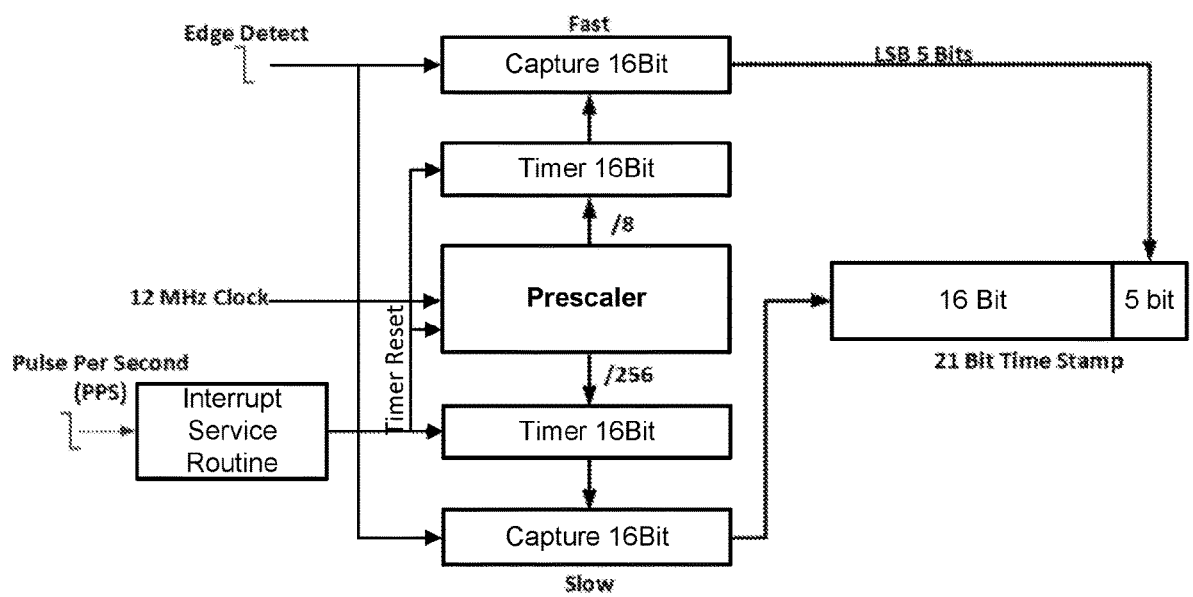
FIG. 12 is a process flow diagram illustrating schematically the process of combining two 16-bit timers to produce a 21-bit timer.

Using this method, timer module 131 operates as an event capture module and leverages, from the available timer (or counter) resources on-board local microcontroller 110, a fast 16-bit timer running at a frequency of 1.5 MHz and a slow 16-bit timer running at a frequency of 46,875 kHz. The 16-bits of the slow timer are combined with the 5 least significant bits of the fast timer to make up the 21-bit timer, as illustrated schematically in FIG. 12. In this method, the eleven most significant bits of the fast timer match/overlap with the eleven least significant bits of the slow timer. The overlapping eleven significant bits are used to detect mis-synchronisation of the counters.

A similar technique of combining two 16-bit timers operating at different speeds can be employed to implement a timer in the range of 17 to 31 bits. More generally, the 16-bits of the slow timer are combined with the 1 to 15 least significant bits of the fast timer to produce the 17 to 31-bit timer. Generally, the fast 16-bit timer should be configured to run in the MHz range and the slow 16-bit timer to runs in the KHz range.

Coincidence Radiation Detection Device

Figure 3:
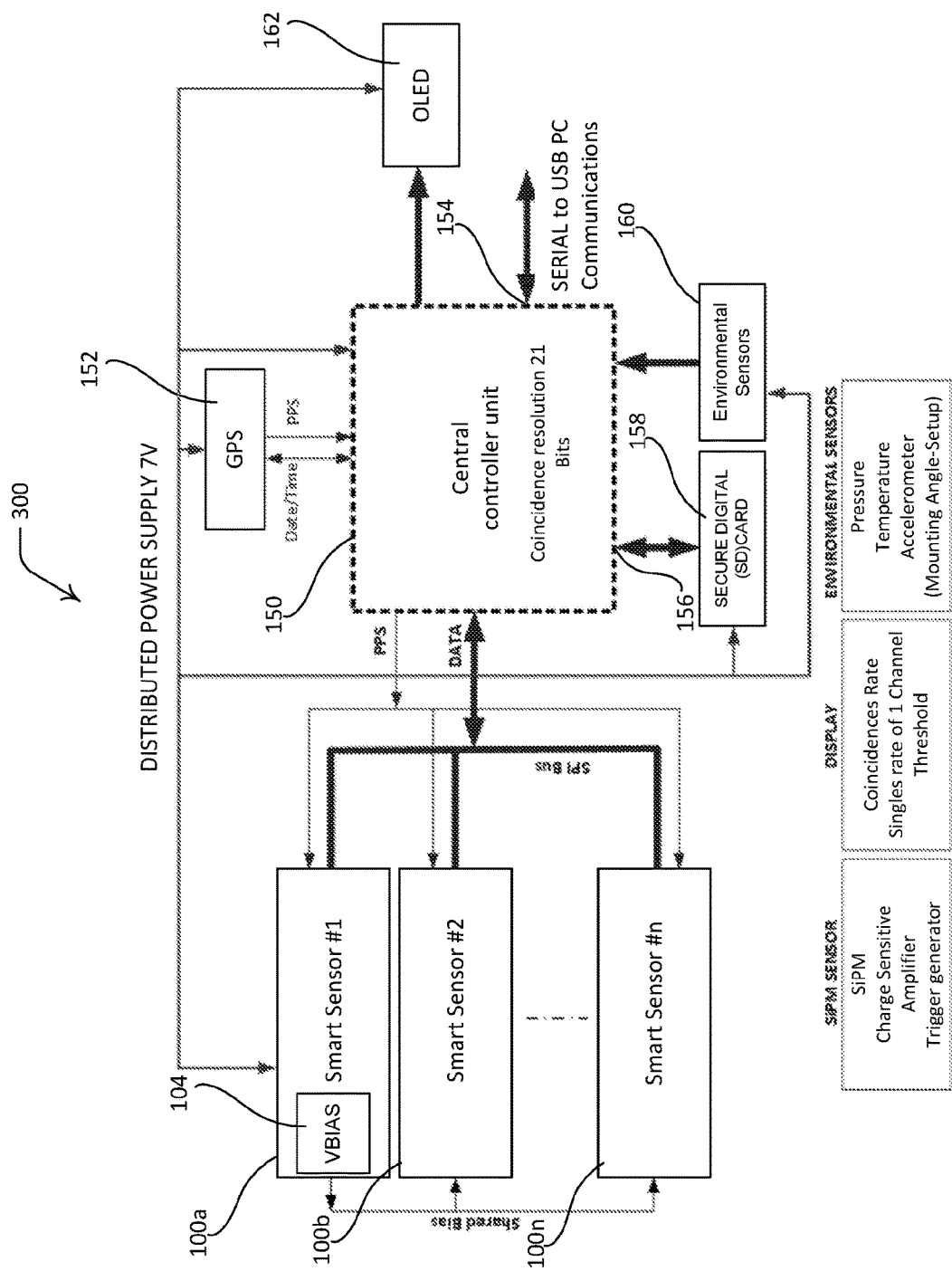
FIG. 3 is a schematic system-level diagram of a coincidence radiation detection system including a plurality of sensors as illustrated in FIG. 1.

Referring now to FIG. 3, the operation of coincidence radiation detection device 300 will be described.

Device 300 includes a plurality of sensors 100a-n similar to those described above for individually performing detection of incident radiation events of charged sub-atomic particles. As illustrated, only sensor 100a includes a bias voltage circuit 104, which is connected to an external power source (not shown), and this sole bias voltage is shared across the other sensors in parallel. It will be appreciated that, in different embodiments, more than one sensor may include a bias voltage circuit or bias voltage circuit 104 may be located separate to each sensor and connected in parallel across each sensor to provide a common bias voltage.

Device 300 also includes a central controller unit 150 in data communication with each of sensors 100a-n via an SPI bus or another data communication protocol. Central controller unit 150 is configured to receive the timestamp values and pulse height values periodically or in real-time from each sensor 100a-100n and perform synchronisation of the reference clock signals of each sensor to a common clock signal (PPS) such as a GPS signal from a GPS module 152. Alternatively, or in conjunction with the synchronisation, central controller unit 150 may also distribute the common clock signal to each sensor as a reference clock signal. In other embodiments, GPS module 152 may be replaced with any other suitable high precision clock source.

Central controller unit 150 may comprise or leverage any commercially available device. However, by way of example, central controller unit may be an ATMega328PB or ATMega2560 device, both of which are developed by Microchip Technology Inc. In some embodiments, a PC may be used as a proxy central controller unit 150.

Central controller unit 150 subsequently evaluates the timestamp values and pulse height values to determine coincidence events in which pulses are detected within a pre-determined time window across at least two of the sensors. In various embodiments, central controller unit 150 may be programmed to process the timestamp values and pulse height values periodically (at predetermined intervals), in real-time or near real-time depending on specific data and power requirements for the application.

In addition to processing the data, central microprocessor 150 is able to store the data for offline coincidence analysis or historical data analysis. To perform data storage, central controller unit 150 includes a serial to USB communication port 154 (e.g. RS232 to USB converter) for connecting the controller to a PC or other data storage and processing device. Central controller unit 150 also includes a SD memory card slot 156 for receiving a SD memory card 158 for local data storage. In some embodiments, central controller unit 150 includes internal memory such as RAM or EEPROM for locally storing and/or buffering the timestamp values and pulse height values from each sensor.

Central controller unit 150 is also in data communication with various sensor devices such as environmental sensors 160 for receiving pressure and/or temperature data of a local environment in which device 300 is located. Environmental sensors 160 may include commercially available temperature and pressure sensors. By way of example, device 300 may be located in an underground mine site subject to high temperature and pressure. Central controller unit 150 may also be in data communication with an accelerometer for receiving data indicative of an orientation of device 300 in two or more dimensions. By way of example, central controller unit 150 may include an on-board micro-electro-mechanical system (MEMS) accelerometer to determine the gravitational vector and the orientation of device 300 is determined by central controller unit 150 based on this gravitational vector. Environmental data of pressure and angle are important as the count rate of charged cosmic particles such as muons depends on these parameters.

As central controller unit 150 does not perform any critical-timing tasks (this is performed by the local micro-controllers), enough resources are available for carrying out background tasks in running the equipment and communicating with external devices without the loss of critical data. In operation, central controller unit 150 configures GPS module 152 and collects the time and date information. Central controller unit 150 also distributes the PPS common clock signal to sensors 100a-n from GPS module 152. If GPS module 152 or another external clock source is not present or inactive, an internal clock of central controller unit 150 (such as a crystal oscillator) may serve as the source of the common clock signal.

Central controller unit 150 stores the timestamped data on SD card 158, monitors and records the data from environmental sensors 160 (e.g. pressure, temperature and resting angle), displays statistics (configuration count, coincidence count, singles rate and a simple histogram of pulse heights) onto an optional associated OLED display 162. The central microprocessor 150 transfers the stored data or real-time coincidence data to a PC via USB port for further analysis.

As mentioned above, each sensor 100a-n preferably has its own local clock (e.g. crystal oscillator) and the individual timers of the sensors must be brought to a common time frame for coincidence timing measurement by using a shared external PPS common clock signal. In device 300, the PPS common clock signal serves a dual purpose:

1) It resets the timestamp counters and advances the seconds counter in each sensor, thus synchronizing all connected sensors at PPS intervals; and
2) It serves as a master reference to quantify the inherent frequency tolerance error in each crystal oscillator of the sensors after each PPS synchronisation.

The coincidence window for the above described coincidence system is ~1.32 μs (i.e. +1 timer count). After reset/resync from the PPS clock signal, if the arrival of a scintillation event triggers all sensors 100a-n, a coincidence should be recorded but, due to the drift/deviation caused by a finite crystal tolerance, although a coincidence has occurred, the recorded timing value of the individual sensors may not indicate the coincidence. As each timestamp is being generated (in real-time), a Correction_Factor (CF) calculated at the end of the previous PPS cycle is applied. An example calculation of a Correction_Factor is provided below. As the crystals are inherently stable within the range of seconds, it is possible to use a correction factor calculated from the previous PPS cycle and apply it to the event timestamps in the next consecutive PPS cycle. This correction factor may be calculated and applied by local microcontroller 110.

Figure 13:
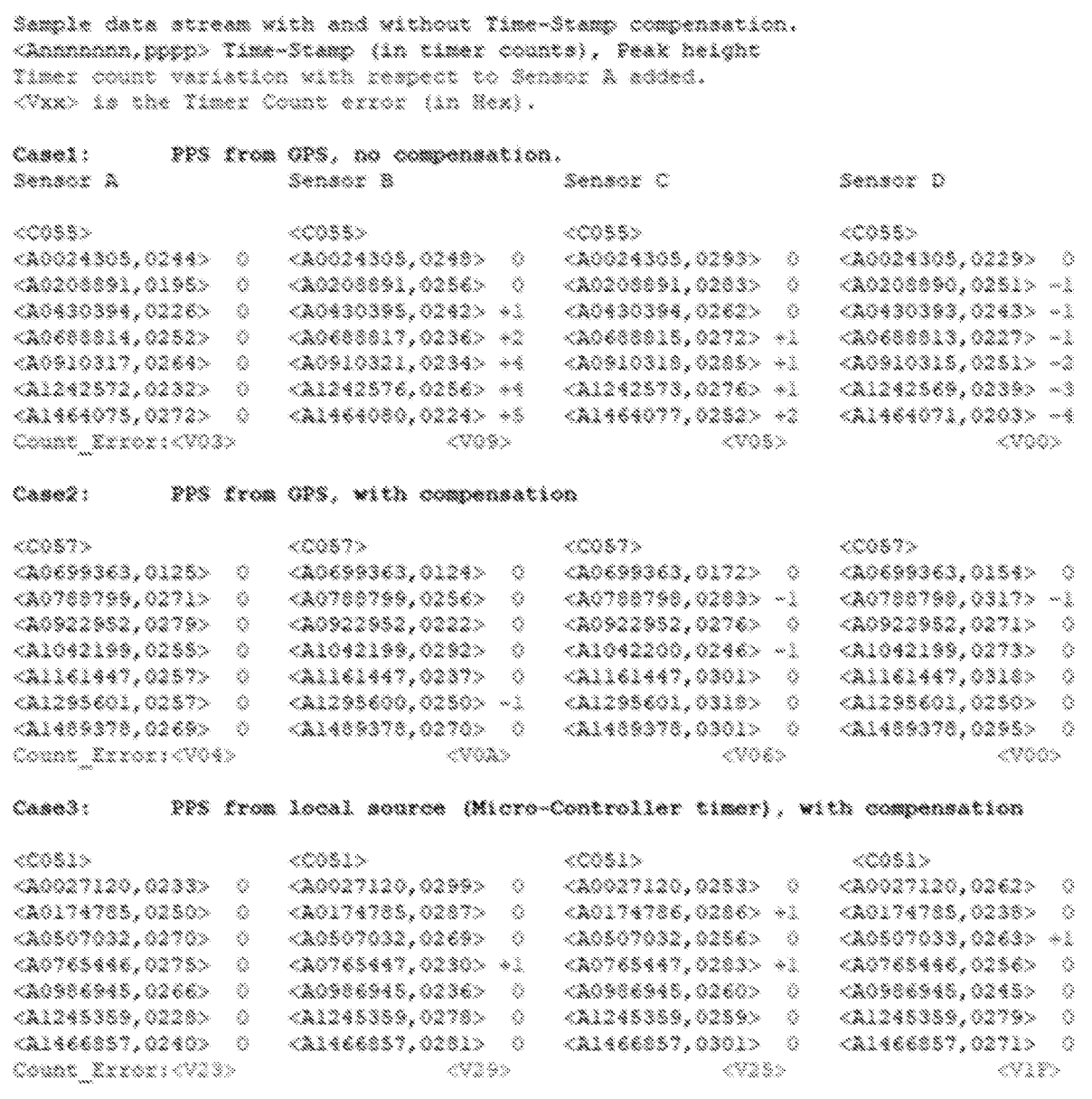

To validate the correction, a first test was performed without a correction factor and GPS as the PPS source, and results showed deviation from the coincidence window. Two further sets of tests were performed, under similar conditions, one using GPS as the PPS source, and the second, a local reference timer as the PPS source, with the appropriate correction factor applied. It was found that the final event timestamp values were within the coincidence window for both the cases. An example of sample timestamped data stream for the three test cases mentioned above, is illustrated in FIG. 13.

As an objective of preferred embodiments of the present invention is to design a low cost and scalable coincidence system using off the shelf components, crystal oscillators with tolerance of +/−0.005% have been used. It is possible to source and replace them with lower tolerance crystal oscillators. However, even with a crystal frequency tolerance of 0.002%, the deviation would be +/−30 clock cycles (~20 µs), which is greater than the coincidence window of ~1.32 µs, necessitating the application of a correction factor.

Example Correction Factor Calculation

When a PPS signal arrives, a Final_Count from each of the individual timers is recorded, and then the timers are reset. Count_Error is the deviation of the Final_Count from the Expected_Final_Count of $(1.5*10^6)$ at the end of every PPS cycle. Count_Error for a given sensor is calculated and the appropriate correction factor applied to the timestamp of every event captured by the particular sensor over the next PPS cycle. Thus, each event is correctly timestamped in real-time. A similar procedure is followed for all the sensors, all of which use the same PPS source.

$$Count\_Error = Final\_Count - Expected\_final\_count \quad (3)$$

This Count Error is used as an index into a lookup table containing pre-calculated CF values.

Calculation of CF $$CF = 1.5*10^6/Final\_Count \quad (4)$$

The binary format of the equation 4 can be expressed as:

$$(N1 \cdot Q32) = (N21 \cdot Q0)/(N21 \cdot Q0)$$

where CF is a 33-bit number, only the fractional (Q32) needs to be stored in the table as the most significant bit of the number can be ascertained from the sign of the final equation.

Typical Example

Final_Count = 1,500,041

CF■ = 1,500,000/1,500,041

= 0.999972667413757

This CF is then converted to 32-bit factional number and placed in a lookup. Example: 0.999972667413757=0× FFFE356F i.e. (N0.Q32).

Absolute Pulse Height Detection

In the sensor 100 illustrated in FIG. 1, the SiPM 102 converts the scintillation pulses into electrical pulses of 2 µs width, which are amplified and shaped by the CSA 106. This analog frontend output fed into edge-peak detector circuit 108, which serves as the trigger for coincidence timing as well as the peak synchronisation of the microcontroller's ADC conversion. The trailing edge of the trigger signal 130 triggered the start of conversion of the microcontroller's (e.g. ATMega328PB) internal ADC 128, which has an 8 µs sampling window.

The primary purpose of sensor 100 is to carry out detection of radiation events, in particular, charged particles such as cosmic muons, using two plastic Polyvinyltoluene (PVT) scintillators operating in coincidence. In this application, relative pulse heights are of primary consideration, and absolute pulse height is not required to high accuracy.

However, in some applications for the SiPM smart sensor, it is advantageous to obtain a measure of the absolute pulse height. During the sampling period by microcontroller 110, the signal decays at an approximately exponential rate. Any deviation of the pulse peak greater than half a least significant bit (LSB) results in reduced accuracy of peak height measurements. The internal ADC 128 of microcontroller 110 includes a sample and hold (S/H) circuit to take the incoming varying analog amplified electrical signal 126 and hold it at a constant value so that ADC 128 can sample it. Detected pulses are sampled for 8 µs after the detection of a peak. Modelling of a derived S/H circuit of an ATMega328PB microcontroller using Simulation Program with Integrated Circuit Emphasis (SPICE) software such as LTSpice indicates that the worst case settling time of the S/H circuit of ATMega328PB is 1.4 µs. This implies that an analog signal should ideally become stable 1.4 µs before the end of this period.

Conventionally, absolute pulse peak values are obtained by sampling the input signal at a high frequency (typically 500 kHz or more) and using the sample closest to the leading edge to calculate the pulse height. However, these parameters are typically beyond the capability of basic low-end microcontrollers. However, the provision of high-speed ADCs and high performance microcontrollers significantly increases the cost and complexity of the circuit, making them prohibitive for applications where cost is a barrier. For example, studying muon tomography requires a number of radiation sensors to be placed at different locations. Furthermore, higher complexity circuitry comes with higher power consumption, which is disadvantageous where the devices are to operate in remote locations such as underground mines.

With reference to FIGS. 14-20, the present inventors have devised a low-cost, upgrade to improve the absolute pulse height resolution of a SiPM based smart sensor such as device 100.

Figure 14:
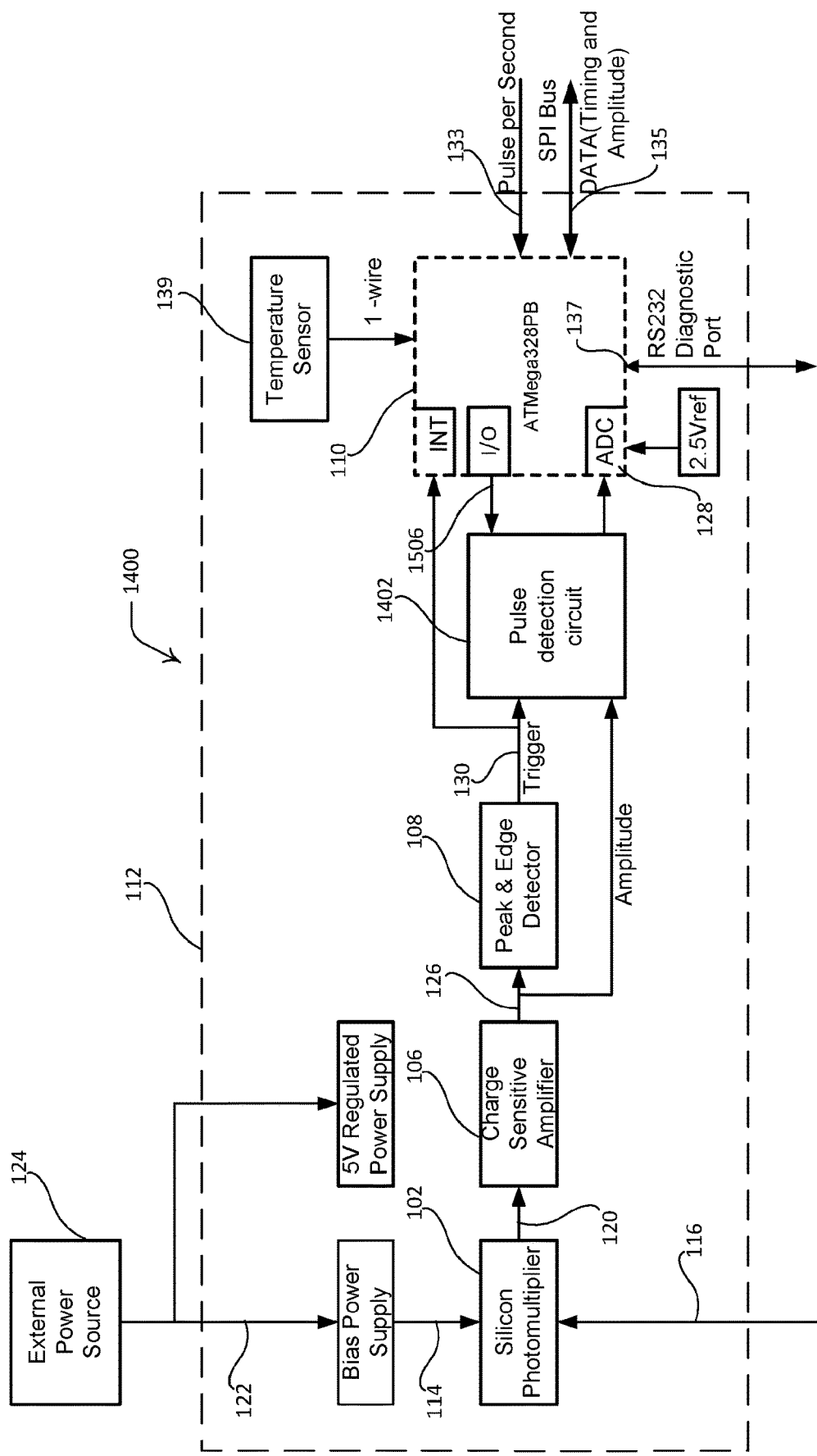
FIG. 14 is a schematic system-level diagram of a sensor for detecting sub-atomic particles incorporating a pulse detection circuit for detecting absolute pulse heights.
Figure 16:
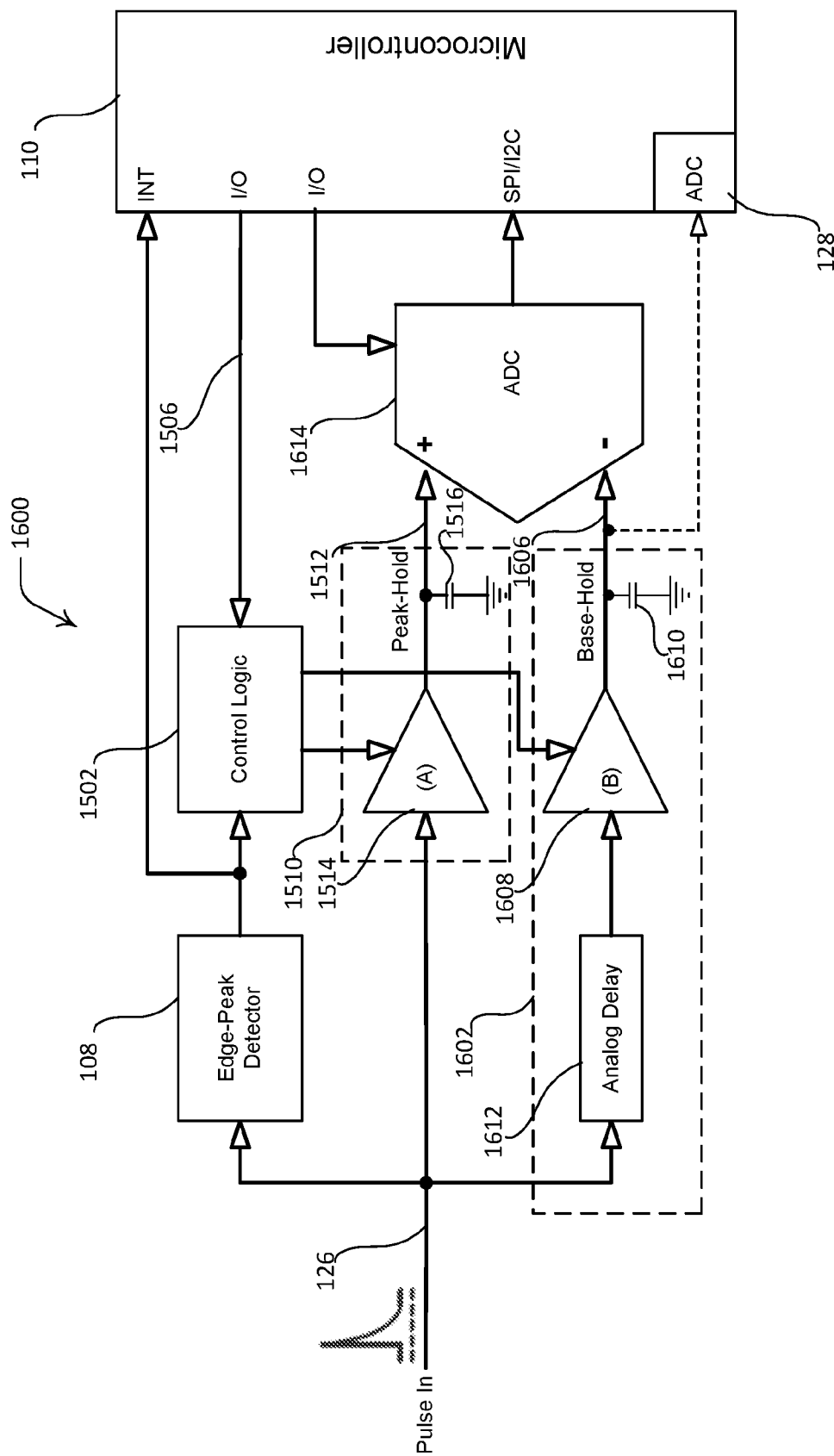
FIG. 16 is a circuit diagram of a pulse detection circuit according to a second embodiment, providing baseline detection capability.
Figure 17:
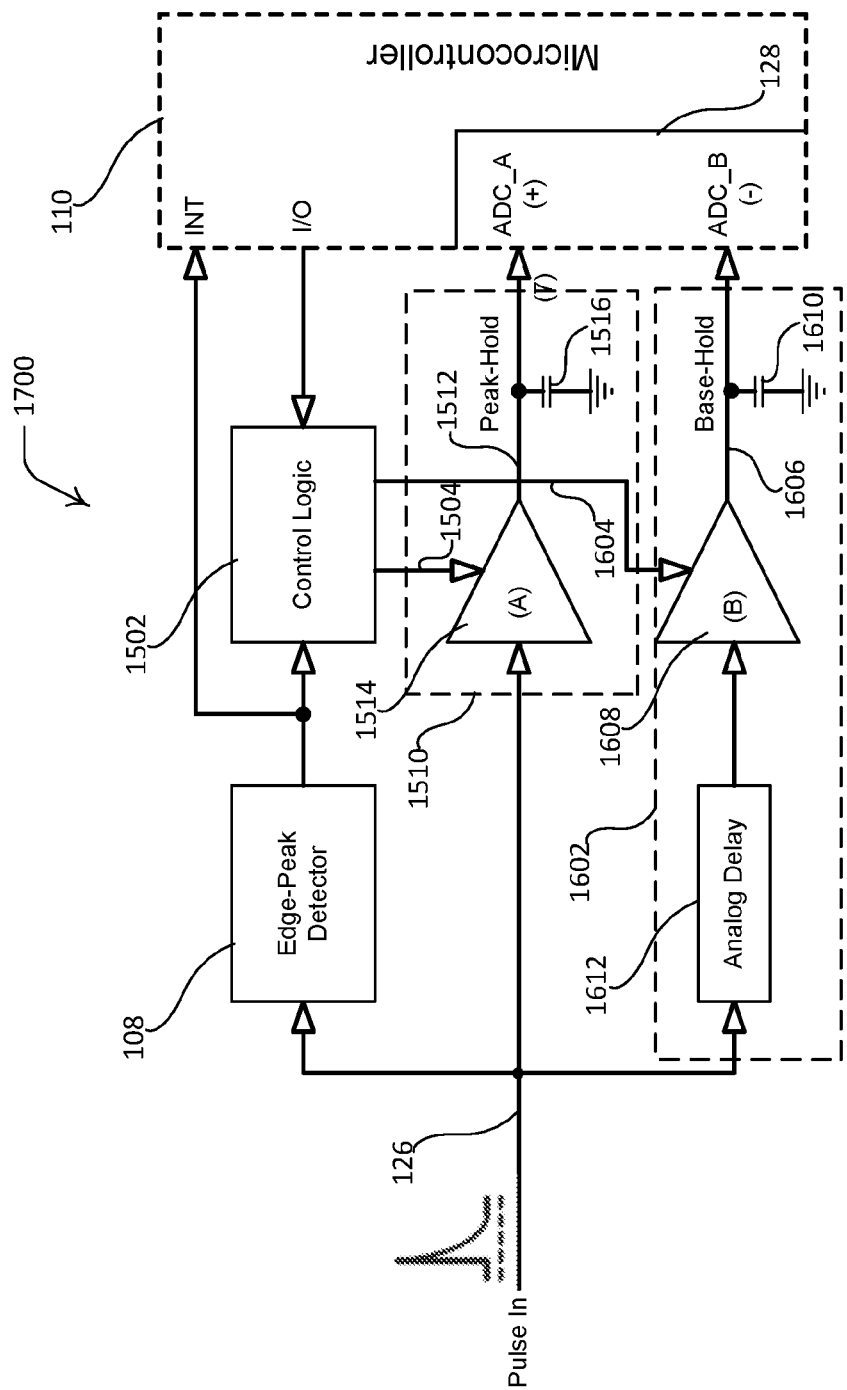
FIG. 17 is a circuit diagram of a pulse detection circuit according to a third embodiment, providing baseline detection capability.

Referring to FIG. 14, there is illustrated a SiPM based smart sensor 1400 wherein elements common to sensor 100 described above are designated with the same reference numerals. Sensor 1400 includes a pulse detection circuit 1402 configured to detect peak pulse values from pulses contained in an input analog signal such as amplified electrical signal 126. A simplified pulse detection circuit 1500 is illustrated schematically in FIG. 15. FIGS. 16 and 17 illustrate more advanced alternative pulse detection circuits 1600 and 1700 having capability for detecting a signal baseline.

Figure 15A:
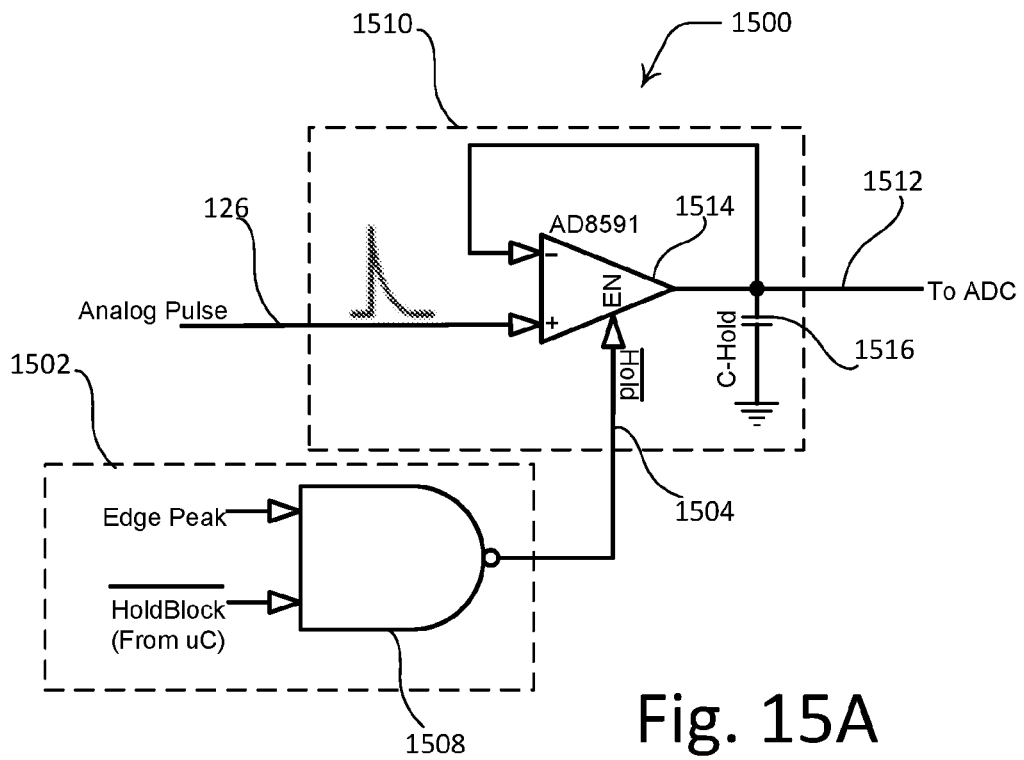
FIG. 15A is a circuit diagram of a pulse detection circuit according to a first embodiment.

Referring initially to FIG. 15A, pulse detection circuit 1500 includes a control circuit 1502 configured to generate a peak control signal 1504 based on a control input 1506 from a microcontroller such as microcontroller 110 and a trigger signal from a peak detector such as signal 130 from edge-peak detector circuit 108. In other embodiments, peak control signal 1504 may be based on input solely from either the microcontroller or a peak detector. Control circuit 1502 is configured to detect a beginning of a trailing edge of pulses within the input analog signal. In control circuit 1502 illustrated in FIG. 15, these signals are combined by way of a single AND logic gate 1508 as described below.

As shown in FIG. 15A, pulse detection circuit 1500 also includes a peak track/hold circuit 1510 responsive to the input analog signal (e.g. amplified electrical signal 126) and peak control signal 1504 to produce an output peak analog signal 1512. Peak track/hold circuit 1510 includes a peak-detect operational amplifier 1514 having three input terminals, two of which are configured to receive the input analog signal (e.g. amplified electrical signal 126) and peak control signal 1504 respectively. Operational amplifier 1514 is a type having a shut-down (or enable) functionality such as AD8591, developed by Analog Devices, Inc. In control circuit 1500, the input analog signal is input to a positive input terminal of operational amplifier 1514 while peak control signal 1504 is input to a shut-down pin. In this manner, the peak control signal 1504 can switch operational amplifier 1514 between an active mode and a shut-down mode as described below. By default, peak control signal 1504 forces operational amplifier 1514 into an enabled mode while, upon detection of a trailing edge of a pulse, peak control signal 1504 switches operational amplifier 1514 into shut-down mode. When in a shut-down mode, the total supply current to the operational amplifier is less than about 1 μA.

Peak track/hold circuit 1510 also includes a peak-hold capacitor 1516 connected at one of its plates to an output terminal of operational amplifier 1514. The other plate of peak-hold capacitor 1516 is connected to ground. The negative input terminal of operational amplifier 1514 is connected to its output terminal to generate a unity gain buffer circuit. This ensures that the output of operational amplifier 1514 duplicates the input. Peak-hold capacitor 1516 preferably has a capacitance in the order of picofarads. By way of example, peak-hold capacitor 1516 may have a capacitance of 560 pF. However, it will be appreciated that the capacitance of peak-hold capacitor 1516 will be dependent on the permissible tolerance in voltage droop over the hold period, which is dependent on the internal current leakage of microcontroller 110 and the maximum capacitive load able to be driven by the OPAMP. To operate efficiently, ideally the permitted voltage droop is less than a half of the LSB of the ADC.

Figure 15B:
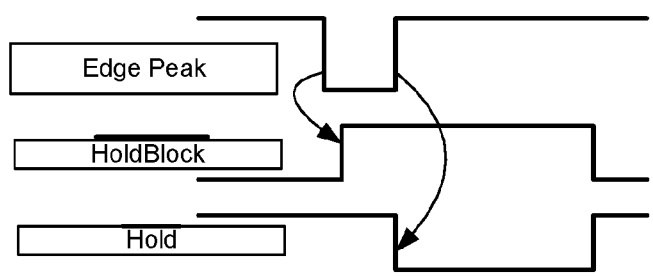
FIG. 15B is a schematic illustration of timing of control signals in the circuit of FIG. 15A.

Referring to both FIGS. 15A and 15B, in circuit 1502, trigger signal 130 from edge-peak detector circuit 108 is held at an upper 'on' value until detection of the leading edge of a pulse, at which time it switches to a lower 'off' value. Microcontroller 110 is adapted to generate a binary 'Hold-Block' signal (representing control input 1506), which has a lower or 'off' value until the edge-peak detector circuit 108 detects a leading edge of a pulse by edge-peak detector circuit 108. Upon detection of the leading edge of a pulse, the microcontroller 110 enables the HoldBlock signal, switching it to an upper or 'on' value of finite voltage. With the HoldBlock signal held on, upon detection of a trailing edge of the pulse by edge-peak detector circuit 108, the trigger signal 130 returns to 'on' and gate 1508 returns an 'off' value to generate a disable peak control signal 1504 which switches operational amplifier 1514 to shut-down mode. The HoldBlock signal from microcontroller 110 is set to be enabled for a predetermined time period before switching off, which results in the peak control signal 1504 switching between the on and off values for a finite duration. The predetermined time period should be greater than the time required for microcontroller 110 to process the signal, including performing analog to digital conversion. This time period is dependent on the components used but, in the illustrated embodiments, is typically in the range of 5-60 μs. The timing of these input signals in control circuit 1502 is illustrated in FIG. 15B.

Peak track/hold circuit 1510 is responsive to the peak control signal 1504 to switch between a tracking mode in which the output peak analog signal 1512 is proportional to the input analog signal 126 and a hold mode wherein the output peak analog signal 1512 is held at a constant peak value indicative of a peak pulse value. In the hold mode, output peak analog signal 1512 is tristated and, as it has an input bias current of <50 pA, the voltage on hold capacitor 1516 is stable to within ½ LSB over the ADC sampling time of about 8 μs. The tracking mode is enabled when the peak control signal 1504 is on and shut-down disabled, while the hold mode is enabled when the peak control signal 1504 is off and shut-down is enabled. As illustrated in FIG. 15B, the control circuit 1502 switches the peak track/hold circuit 1510 from the tracking mode to the hold mode upon detection of a beginning of the trailing edge of pulses within the analog input signal 126 by the edge-peak detector 108 and microcontroller 110.

This method of switching between track and hold is implemented as operational amplifiers incorporating shut-down capability typically have a finite amplifier enable time in the order of 0.6 μs to about 10 μs. Given that pulse peaks for muon detection are reached within about 2 μs of pulse commencement, an excessive enabling time is incompatible with the required timeframes. As such, it is preferable to maintain operational amplifier 1514 in an enabled mode until a pulse peak is detected.

The output peak analog signal 1512 is passed to an analog to digital converter such as internal ADC 128 to produce a corresponding output peak digital signal for subsequent processing by microcontroller 110.

Initial measurements using pulse detection circuit 1402 indicate an improvement in pulse height resolution of the order of about 20% over the pulse measurement by sensor 100 without track and hold capability.

It will be appreciated that the pulse detection circuit 1402 may be implemented without utilising a shut-down feature of an operational amplifier by incorporating circuit switching elements to perform hold and reset functions. However, using an operational amplifier with shut-down capability has the additional benefit of negating the need of additional external switching elements.

Baseline Measurement

To further improve the absolute pulse height resolution, accurate detection of a baseline signal prior to the pulse can also be measured. This baseline detection allows for correction of a fluctuating noisy baseline signal in the end pulse peak measurement. A baseline signal component refers generally to signal components not directly related to a signal of interest (in the present case an incident pulse from muons or other sources). The baseline signal component includes background ambient signals, noise components and other signal components unrelated to the signal of interest.

Referring now to FIGS. 16 and 17, there is illustrated pulse detection circuits 1600 and 1700 having baseline detection capability. Referring initially to FIG. 16, circuit 1600 uses a similar track/hold circuit 1510 as described above in relation to circuit 1500 with the addition of a baseline track/hold circuit 1602 for detecting a baseline signal. Both peak track/hold circuit 1510 and baseline track/hold circuit 1602 receive inputs from the input analog signal (e.g. amplified electrical signal 126) and common control circuit 1502. Here, control circuit 1502 is adapted beyond that in circuit 1500 to generate a baseline control signal 1604 from microcontroller 110 and/or edge-peak detector 108 in addition to the peak control signal 1504. With feedback from edge-peak detector 108, microcontroller 110 is configured to detect a rising edge of pulses within the input analog signal and the rising edge is used to determine a baseline (representing or approximating the baseline signal component) of the input analog signal as described below.

Pulse detection circuit 1600 further includes baseline track/hold circuit 1602 responsive to the input analog signal 126 and baseline control signal 1604 to produce an output baseline analog signal 1606 indicative of the baseline signal component. Baseline track/hold circuit 1602 includes a baseline-detect operational amplifier 1608 having two input terminals configured to receive the input analog signal 126 (or a delayed version thereof as described below) and baseline control signal 1604 respectively. Baseline track/hold circuit 1602 further includes a baseline-hold capacitor 1610 connected to an output terminal of operational amplifier 1608. Like peak-hold capacitor 1516, baseline-hold capacitor 1610 1516 preferably has a capacitance in the order of picofarads based on permissible voltage droop as mentioned above. By way of example, peak-hold capacitor 1516 may have a capacitance of 560 pF.

Figure 19:
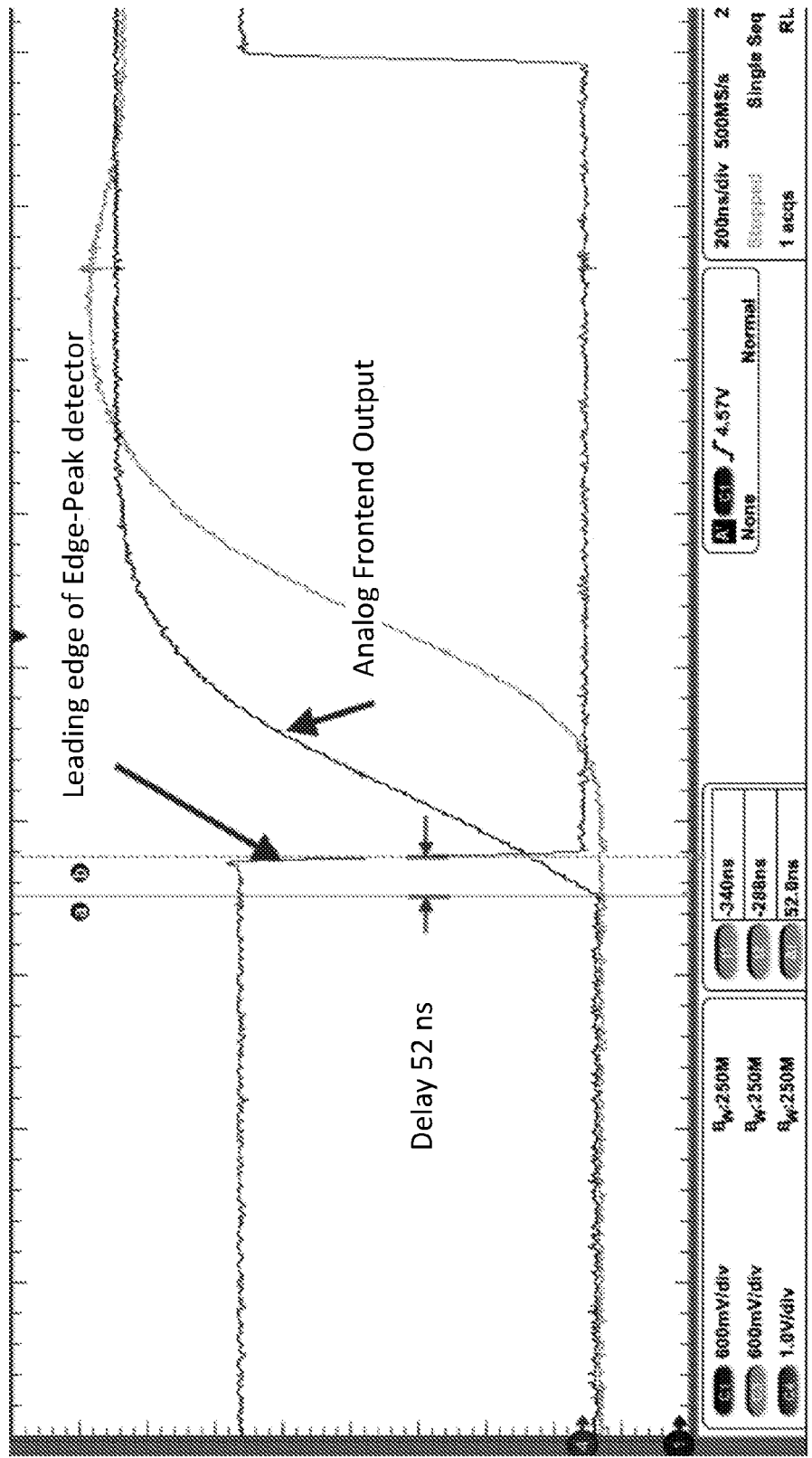
FIG. 19 is a plot of voltage versus time of an output electrical signal and edge-peak detector circuit illustrating time delays and signal responses.

Although not illustrated in FIG. 16, the outputs of baseline detect operational amplifier 1608 and peak detect operational amplifier 1514 may be fed back to respective negative input terminals as feedback loops for stabilisation. These connections are illustrated in FIG. 19, which is a more detailed illustration of circuit 1600.

In a similar manner to the peak track/hold circuit 1510, the baseline track/hold circuit is responsive to the baseline control signal 1604 to switch between a tracking mode in which the output baseline analog signal 1606 is proportional to the input analog signal and a hold mode wherein the output baseline analog signal 1606 is held at a constant value indicative of a value of the input analog signal prior to the pulse arriving (baseline component). The baseline control signal 1606 switches the baseline track/hold circuit 1602 from the tracking mode to the hold mode upon detection of a rising edge of a pulse by the edge-peak detector circuit 108 via control circuit 1502. When the baseline track/hold circuit 1602 is in the hold mode, the baseline-detect operational amplifier 1608 is switched into a shutdown mode.

This allows for measurement of the instantaneous value of the baseline (within about 100 ns) preceding the arrival of the leading edge of the analog input pulse and helps to reduce the significant degradation caused by baseline fluctuations. The absolute pulse height is then quantified by subtracting the measured baseline value from the measured peak value.

As the rising edge of the input analog signal triggers the leading edge of the edge-peak detector circuit 108, there may be a delay of up to 100 ns before the value of the baseline is latched by baseline track/hold circuit 1602. This is illustrated in FIG. 19, which shows a delay of about 52 ns between an onset of a rising edge of the input analog signal and the triggering of edge-peak detector circuit 108.

Given this finite delay, baseline track/hold circuit 1602 includes an analog delay circuit such as analog delay line 1612 in the incoming signal path and connected to the positive input terminal of the baseline-detect operational amplifier 1608 to apply a predefined time delay to the received input analog signal. Preferably delay line 1612 provides a delay of greater than 100 ns. However, more generally, analog delay line 1612 delays the input analog signal by a time delay to compensate for the finite response time of the edge-peak detect circuit. This finite response time can be calculated from measurements such as that illustrated in FIG. 19.

Figure 18:
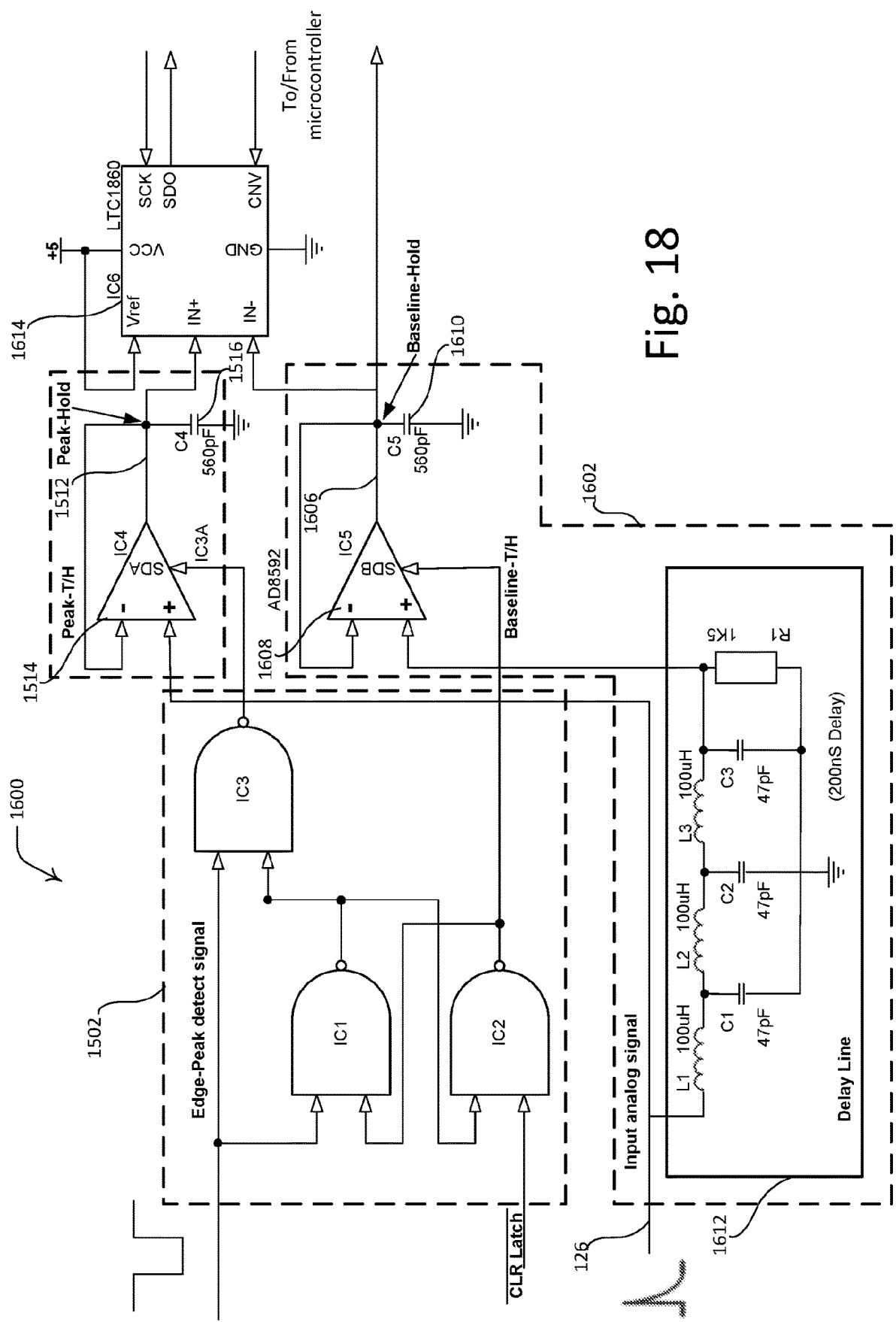
FIG. 18 is a circuit diagram of the circuit of FIG. 16 illustrating greater details of components.

Referring now to FIG. 18, a more detailed view of peak control circuit 1600 illustrates an exemplary delay line 1612 providing a delay of about 200 ns. Delay line 1612 is a 3-stage LC delay line including three series inductors (L1, L2 and L3), three parallel capacitors (C1, C2 and C3) and a resistor (R1). The output of delay line 1612 is fed to the positive input terminal of baseline detect operational amplifier 1608.

As illustrated in FIGS. 16 and 18, pulse detection circuit 1600 utilises an external differential ADC 1614. The output baseline analog signal 1606 is input to a negative input terminal of differential ADC 1614 and output peak analog signal 1512 is input to a positive input terminal of differential ADC 1614.

Figure 20:
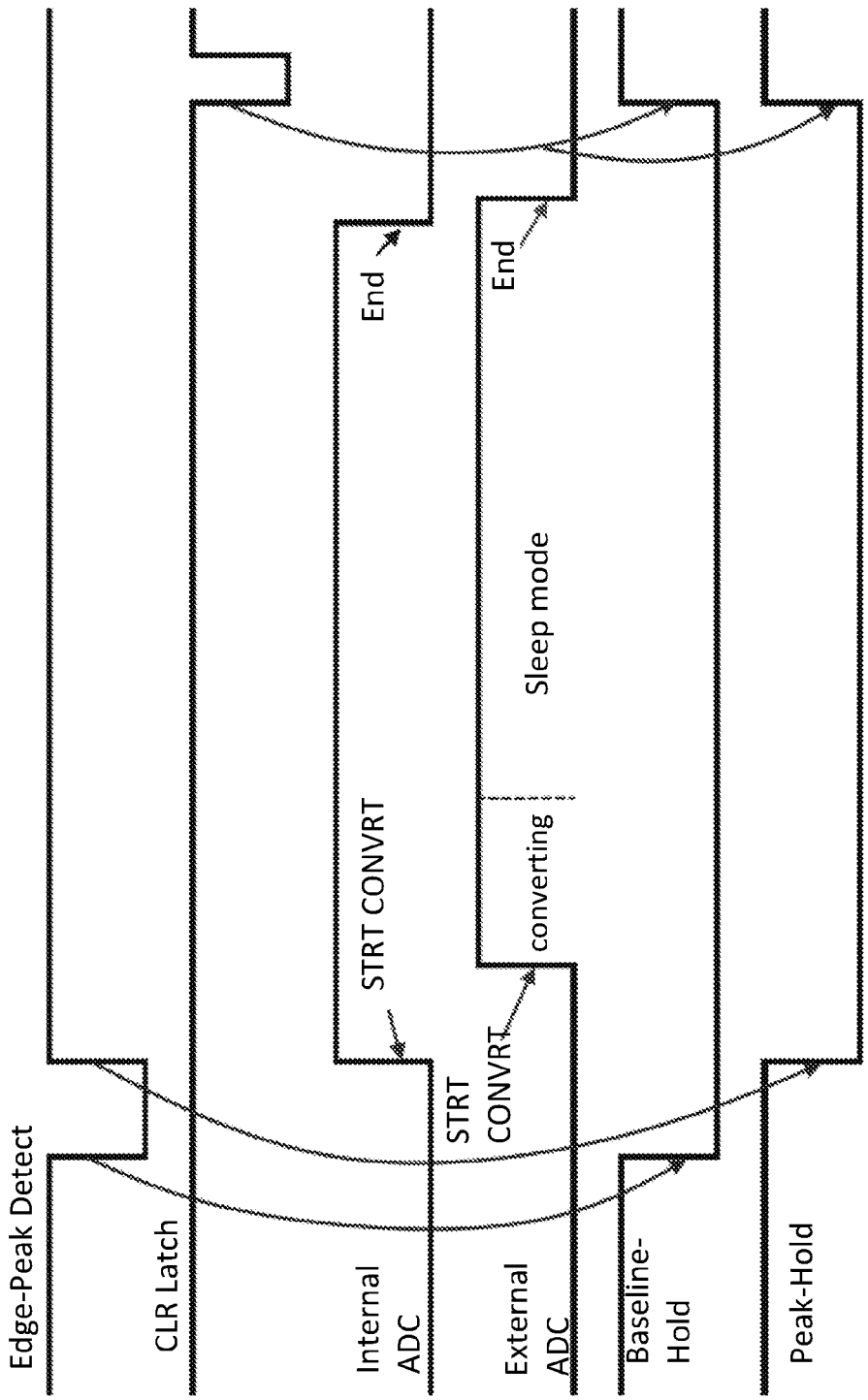
FIG. 20 is a schematic illustration of timing of control signals in the circuit of FIGS. 16 and 18.

The timing of the various control signals implemented in circuit 1600 is illustrated schematically in FIG. 20.

Before the arrival of an input analog signal both the peak and baseline-track/hold circuits 1510 and 1602 are in tracking mode. The arrival of the input signal triggers the leading edge of edge-peak detector 108, enabling the hold (baseline-hold) for the baseline-track/hold circuit 1602. At this time, peak track/hold circuit 1510 is still in tracking mode. Once the input analog signal reaches its peak value, the trailing edge of the edge-peak detector 108 changes state, enabling the hold (Peak-hold) for the peak track/hold circuit 1510. The outputs of peak and baseline track/hold circuits are fed to external differential ADC 1614.

After the completion of the entire process the track/hold circuits are reset (CLRLatch) to tracking mode by microcontroller 110. The external differential ADC 1614 cannot in and of itself detect if the input analog signal pulse (CSA output) has saturated and/or if the baseline is within acceptable range for the external differential ADC 1614. Hence, the output of the baseline track/hold circuit 1602 is simultaneously fed to the internal slow ADC 128 of microcontroller 110 to independently detect if the pulse height has reached the positive saturation region of the CSA 106 as well as the over-range of the baseline.

It can be observed that the external differential ADC 1614 after conversion (conversion time of about 2.75 µs) switches into sleep mode and a stand-offset voltage is impressed upon the peak and baseline-hold capacitors 1516 and 1610. Hence the start convert signal to the external differential ADC 1614 is triggered by the microcontroller and is suitably delayed at a time>about 7 µs as shown in FIG. 20 after the peak-detect signal, ensuring a steady baseline-hold output during the sampling period of the internal ADC 128 of microcontroller 110 (i.e. about 8 µs).

Referring now to FIG. 17, there is illustrated a further pulse detection circuit 1700 that is capable of performing baseline detection. Circuit 1700 is similar to that of circuit 1600 but only utilises internal ADC 128 that is included within microcontroller 110 to perform a pseudo differential operation. This provides further cost saving by eliminating the need for an external ADC.

In circuit 1700, the peak and baseline track/hold circuit outputs are sampled consecutively by the microcontroller's single internal ADC 128. An analog time division multiplexer within ADC 128 is first switched to the output peak signal which is digitised by internal ADC 128. Then the multiplexer is switched to the output baseline signal 1606 for digitisation. The digitisation of the peak and the baseline signals each take about 90 µs to complete. This method has the disadvantage that when the multiplexer is switched it would cause a transfer of charge between a sample/hold capacitor within internal ADC 128 and the external track/hold capacitor causing a voltage offset. To reduce this effect, the multiplexer may be switched to a default state of sampling of peak-hold. Next, the internal multiplexer of ADC 128 is switched to 1.1 V internal reference which is closer to the baseline voltage (about 700 mV) followed by switching to the output baseline signal 1606 thus minimising the shift in baseline output voltage. This results in a stand-off voltage of the order of 60 mV, which equates to an error of the order of about 13 ADC channels ((60÷4.88)=12.29). This method has the principal advantage of allowing direct detection of amplifier saturations and baseline over-range conditions.

Initial measurements of circuits 1600 and 1700 utilising both peak and baseline detection circuits indicate that a further improvement in pulse height resolution of about 8% over using only peak track/hold detection (e.g. circuit 1500) can be achieved.

CONCLUSIONS

It will be appreciated that the above described coincidence radiation detection device 300 provides a low-cost, light-weight, low power, portable coincidence system capable of being constructed based on autonomous smart sensors 100*a-n* using off-the-shelf SiPMs and microcontrollers. The system is suitable for detecting radiation events within a coincidence window of ~1.32 µs, which includes charged particle events such as muons. It is possible to obtain a narrower coincidence window by adding more bits to the timer. Such a modification could potentially result in achieving 0.67 µs or 0.34 µs windows respectively for 22 bit and 23 bit timers using a 12 MHz clock. However, other limiting factors will come into play in achieving shorter coincidence windows, such as possible Edge detector jitter and a larger look-up table.

Software techniques have been developed which allow the device to perform real-time self-compensation and synchronisation of multiple smart sensors with an external GPS or a self-referencing clock. The system is suitable for surface and subterranean coincidence based measurements. Each sensor 100*a-n* has good timing accuracy through a combination of the SiPM plus a software generated timing system with 21-bit precision.

The use of SiPMs reduces the power consumption, high voltage requirements, cost and physical dimensions of the system relative to traditional photomultiplier tubes. There are, however, disadvantages in using SiPMs in that they possess a large dark current and have an inherent capacitance. In the present invention, the former disadvantage is mitigated by setting a higher detection threshold, the latter by implementing an on-board electronics charge sensitive amplifier.

A single bias voltage supply circuit feeds multiple sensors to give a constant power source without further regulation. This reduces the electronics required and the noise generated. Both of these are disadvantages commonly encountered when using multiple scintillation detectors but are addressed in the present invention.

Specifically designed electronic systems, including microcontrollers, as well as specific control software enable accounting for timing drift and enable real-time coincidences within a coincidence-window of ~1.32 µs. A novel hybrid timing system combining two 16-bit timers provides 21-bit timing created from inexpensive, crystal clock sources with high frequency tolerance.

An advantage of having real time coincidence capability, as well as inbuilt storage for offline analysis, is that it allows great flexibility with a 'plug-and-play' approach that is far from standard in more expensive designs.

The modular and rugged design supports real-time coincidence as well as offline analysis, and permits easy scalability to fewer or greater numbers of sensors 100*a-n* without reconfiguring the remaining device. These advantages make it more suitable for deployment in environments typically deemed harsh for electronics, such as in subterranean mining operations where high temperature, pressure and limited power supply are encountered.

Deploying a number of devices 300 at several locations concurrently permits event reconstruction and absorption studies; known as muon tomography. This process has great potential in resource exploration both by reducing the number of exploration boreholes required to map green field sites as well as improving the identification and recovery of ore bodies within existing sites.

Long term deployment of these cost effective and rugged radiation sensors allows passive, non-invasive monitoring of rock stability and air cavity formation in block caving, as well as mining sites more generally. This can be extended to long term monitoring of the stability of carbon sequestration sites for example.

Embodiments of the present invention also provide viable options for a range of applications such as education and outreach, for globally distributed coincidence systems, medical imaging, and background radiation detection in homes, industry and academia.

Embodiments of the present invention provide a simple, and low-cost, upgrade to improve the absolute pulse height resolution of a SiPM based smart sensor. This solution has been realised by designing an external Track/Hold (T/H) circuit leveraging the on-board microcontroller and signal conditioning circuit of the existing SiPM smart sensor system. The external T/H circuits are applied to the pulse peak as well as the baseline of the SiPM smart sensor.

Accurate absolute pulse height measurements can be achieved cost effectively using an external track/hold circuit without the need for an expensive fast microcontroller. Additional baseline tracking using a second track/hold circuit can further improve the pulse height measurements. These improvements can be achieved using a relatively slow microcontroller (e.g. ATMega328PB) with an ADC having a sampling rate in the kHz range and potentially below 500 KHz.

Interpretation

Unless specifically stated otherwise, as apparent from the following discussions, it is appreciated that throughout the specification discussions utilizing terms such as "processing," "computing," "calculating," "determining", analysing" or the like, refer to the action and/or processes of a computer or computing system, or similar electronic computing device, that manipulate and/or transform data represented as physical, such as electronic, quantities into other data similarly represented as physical quantities.

In a similar manner, the term "microcontroller", "controller" or "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Reference throughout this specification to "one embodiment", "some embodiments" or "an embodiment" means that a particular feature, structure or characteristic described in connection with the embodiment is included in at least one embodiment of the present disclosure. Thus, appearances of the phrases "in one embodiment", "in some embodiments" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

It should be appreciated that in the above description of exemplary embodiments of the disclosure, various features of the disclosure are sometimes grouped together in a single embodiment, Fig., or description thereof for the purpose of streamlining the disclosure and aiding in the understanding of one or more of the various inventive aspects. This method of disclosure, however, is not to be interpreted as reflecting an intention that the claims require more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those skilled in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical, electrical or optical contact, or that two or more elements are not in direct contact with each other but yet still co-operate or interact with each other.

Embodiments described herein are intended to cover any adaptations or variations of the present invention. Although the present invention has been described and explained in terms of particular exemplary embodiments, one skilled in the art will realize that additional embodiments can be readily envisioned that are within the scope of the present invention.

What is claimed is:

1. A pulse detection circuit configured to detect peak pulse values from pulses contained in an input analog signal, the pulse detection circuit including:
   a control circuit to detect a beginning of a trailing edge of pulses within the input analog signal and generate a peak control signal based on input from a microcontroller and/or a peak detector circuit, wherein the microcontroller and/or the peak detector circuit is separate to the pulse detection circuit;
   a peak track/hold circuit responsive to the input analog signal and peak control signal to produce an output peak analog signal, the peak track/hold circuit including:
      a peak-detect operational amplifier having an output terminal and three input terminals, wherein:
         a positive input terminal of the three input terminals receives the input analog signal,
         a negative input terminal of the three input terminals is connected to the output terminal of the peak-detect operational amplifier, and
         the peak control signal is input to a shut-down input terminal of the three input terminals; and
      a peak-hold capacitor connected to the output terminal of the peak-detect operational amplifier; and
   an analog to digital converter configured to receive the output peak analog signal and produce a corresponding output peak digital signal,
   wherein the peak track/hold circuit is responsive to the peak control signal to switch between a tracking mode in which the output peak analog signal is proportional to the input analog signal and a hold mode wherein the output peak analog signal is held at a constant peak value indicative of a peak pulse value, and
   wherein, upon the arrival of the peak control signal generated from the control circuit, the peak track/hold circuit switches from the tracking mode to the hold mode.

2. The pulse detection circuit according to claim 1, wherein the peak track/hold circuit switches from the tracking mode to the hold mode upon detection of a beginning of the trailing edge of pulses within the analog input signal by the peak detector circuit and/or the microcontroller.

3. The pulse detection circuit according to claim 1, wherein the control circuit is further configured to generate a baseline control signal based on input from the microcontroller and/or the peak detector circuit, wherein the microcontroller and/or the peak detector circuit is configured to also detect a rising edge of pulses within the input analog signal.

4. The pulse detection circuit according to claim 3 further including a baseline track/hold circuit responsive to the input analog signal and baseline control signal to produce an output baseline analog signal, the baseline track/hold circuit including:
- a baseline-detect operational amplifier having first and second input terminals to receive the input analog signal and baseline control signal respectively; and
- a baseline-hold capacitor connected to an output terminal of the operational amplifier, wherein the baseline track/hold circuit is responsive to the baseline control signal to switch between a tracking mode in which the output baseline analog signal is proportional to the input analog signal and a hold mode wherein the output baseline analog signal is held at a constant value indicative of a value of the input analog signal prior to the pulse arriving, and wherein the baseline control signal switches the baseline track/hold circuit from the tracking mode to the hold mode upon detection of a rising edge of a pulse by the microcontroller and/or the peak detector circuit.

5. The pulse detection circuit according to claim 4 further including an analog delay circuit connected to the first input terminal of the baseline-detect operational amplifier to apply a time delay to the received input analog signal.

6. The pulse detection circuit according to claim 5, wherein the analog delay circuit includes an analog delay line.

7. The pulse detection circuit according to claim 5, wherein the peak detector circuit has a finite response time and the analog delay circuit delays the input analog signal by a time delay to compensate for the finite response time.

8. The pulse detection circuit according to claim 1, wherein the analog to digital converter is a low sample rate device having a sampling rate in the kHz range.

9. The pulse detection circuit according to claim 1, wherein the peak control signal switches the peak-detect operational amplifier into a shutdown mode when the peak track/hold circuit is in the hold mode.

10. The pulse detection circuit according to claim 4, wherein the baseline control signal switches the baseline-detect operational amplifier into a shutdown mode when the baseline track/hold circuit is in the hold mode.

11. The pulse detection circuit according to claim 4, wherein the analog to digital converter is a differential analog to digital converter, and wherein the output baseline analog signal is input to a first input terminal of the differential analog to digital converter and the output peak analog signal is input to a second input terminal of the differential analog to digital converter.

12. The pulse detection circuit according to claim 1, wherein the analog to digital converter is included within the microcontroller and/or the peak detector circuit.

13. The pulse detection circuit according to claim 4, wherein the analog to digital converter is an external analog to digital converter that is external to the microcontroller and/or the peak detector circuit.

14. The pulse detection circuit according to claim 13, wherein the output baseline analog signal is simultaneously fed to the external analog to digital converter and an analog to digital converter within the microcontroller and/or the peak detector circuit to detect a saturation and/or baseline outside of a predetermined range for the input analog pulse.

15. A pulse detection method to detect peak pulse values from pulses contained in an input analog signal, the pulse detection method including:
- generating a peak control signal based on input from a microcontroller and/or a peak detector circuit;
- inputting the input analog signal and the peak control signal to a peak track/hold circuit to produce an output peak analog signal,
- wherein the peak track/hold circuit includes a peak-detect operational amplifier having an output terminal and three input terminals, wherein:
  - a positive input terminal of the three input terminals receives the input analog signal,
  - a negative input terminal of the three input terminals is connected to the output terminal of the peak-detect operational amplifier, and
  - the peak control signal is input to a shut-down input terminal of the three input terminals,
- wherein the peak track/hold circuit is responsive to the peak control signal to switch between a tracking mode in which the output peak analog signal is proportional to the input analog signal and a hold mode wherein the output peak analog signal is held at a constant peak value indicative of a peak pulse value, and
- wherein the peak control signal switches the peak track/hold circuit from the tracking mode to the hold mode upon detection of a beginning of a trailing edge of a pulse by the microcontroller and/or the peak detector circuit; and
- transmitting the output peak analog signal to an analog to digital converter to produce a corresponding output peak digital signal,
- wherein the microcontroller and/or a peak detector circuit is separate to the peak track/hold circuit.

16. The pulse detection method according to claim 15, wherein the peak control signal includes an indication of a beginning of a trailing edge of pulses within the input analog signal and the peak track/hold circuit switches from the tracking mode to the hold mode upon detection of the beginning of a trailing edge of pulses within the analog input signal by the peak detector circuit and/or the microcontroller.

17. The pulse detection method according to claim 15 further including the step of generating a baseline control signal based on input from the microcontroller and/or the peak detector circuit, wherein the microcontroller and/or the peak detector circuit is configured to also detect a rising edge of pulses within the input analog signal.

18. The pulse detection method according to claim 17 further including the step of:
- inputting the input analog signal and baseline control signal to a baseline track/hold circuit to produce an output baseline analog signal, wherein the baseline track/hold circuit is responsive to the baseline control signal to switch between a tracking mode in which the output baseline analog signal is proportional to the input analog signal and a hold mode wherein the output analog signal is held at a constant value indicative of a value of the input analog signal prior to the pulse arriving, and wherein the baseline control signal switches the baseline track/hold circuit from the tracking mode to the hold mode upon detection of a rising edge of a pulse by the microcontroller and/or the peak detector circuit.

19. The pulse detection method according to claim 18 further including the step of applying a time delay to the received input analog signal before input to the baseline track/hold circuit.

20. The pulse detection method according to claim 19, wherein the time delay is equal to or greater than a finite response time of the microcontroller and/or the peak detector circuit.

\* \* \* \* \*